United States Patent
Huo et al.

(10) Patent No.: US 11,758,731 B2
(45) Date of Patent: *Sep. 12, 2023

(54) THREE-DIMENSIONAL MEMORY DEVICE HAVING A SHIELDING LAYER AND METHOD FOR FORMING THE SAME

(71) Applicant: YANGTZE MEMORY TECHNOLOGIES CO., LTD., Wuhan (CN)

(72) Inventors: Zongliang Huo, Wuhan (CN); Zhiliang Xia, Wuhan (CN); Li Hong Xiao, Wuhan (CN); Jun Chen, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 240 days.

This patent is subject to a terminal disclaimer.

(21) Appl. No.: 17/322,751

(22) Filed: May 17, 2021

(65) Prior Publication Data

US 2021/0272976 A1    Sep. 2, 2021

Related U.S. Application Data

(63) Continuation of application No. 16/140,427, filed on Sep. 24, 2018, now Pat. No. 11,043,506, which is a
(Continued)

(51) Int. Cl.
*G11C 5/06* (2006.01)
*H10B 43/40* (2023.01)
(Continued)

(52) U.S. Cl.
CPC ............ *H10B 43/40* (2023.02); *G11C 5/06* (2013.01); *H10B 41/35* (2023.02); *H10B 41/41* (2023.02);
(Continued)

(58) Field of Classification Search
CPC ........ H10B 43/40; H10B 41/35; H10B 41/41; H10B 43/27; H10B 43/35; H10B 43/50;
(Continued)

(56) References Cited

U.S. PATENT DOCUMENTS

| 2008/0173932 A1* | 7/2008 | Kidoh | H10B 43/27 257/E21.679 |
| 2011/0101351 A1* | 5/2011 | Yamazaki | H01L 29/78693 257/E27.113 |

(Continued)

FOREIGN PATENT DOCUMENTS

| CN | 1447429 A | 10/2003 |
| CN | 104981899 A | 10/2015 |

(Continued)

OTHER PUBLICATIONS

International Search Report issued in corresponding International Application No. PCT/CN2018/093423, dated Mar. 27, 2019, 5 pages.
(Continued)

*Primary Examiner* — S M Sohel Imtiaz
(74) *Attorney, Agent, or Firm* — Bayes PLLC

(57) ABSTRACT

A three-dimensional (3D) memory device includes a peripheral device, a plurality of memory strings, a layer between the peripheral device and the plurality of memory strings, and a contact. The layer includes a conduction region and an isolation region. The contact extends through the isolation region of the layer.

20 Claims, 12 Drawing Sheets

Related U.S. Application Data continuation of application No. PCT/CN2018/093423, filed on Jun. 28, 2018.

(51) Int. Cl.
    *H10B 41/35*     (2023.01)
    *H10B 41/41*     (2023.01)
    *H10B 43/27*     (2023.01)
    *H10B 43/35*     (2023.01)
    *G11C 16/06*     (2006.01)

(52) U.S. Cl.
    CPC ............. *H10B 43/27* (2023.02); *H10B 43/35* (2023.02); *G11C 16/06* (2013.01)

(58) Field of Classification Search
    CPC ....... G11C 5/06; G11C 16/06; G11C 16/0483; H01L 23/5225; H01L 23/552; H01L 24/92; H01L 24/05; H01L 24/06
    See application file for complete search history.

(56) References Cited

U.S. PATENT DOCUMENTS

| | | | |
|---|---|---|---|
| 2012/0025284 A1* | 2/2012 | Kato | H10B 41/70 257/296 |
| 2012/0062777 A1 | 3/2012 | Kobayashi et al. | |
| 2014/0225235 A1* | 8/2014 | Du | H01L 27/0688 257/659 |
| 2014/0262475 A1 | 9/2014 | Liu et al. | |
| 2014/0284713 A1* | 9/2014 | Kutsukake | H01L 29/42392 257/337 |
| 2016/0079164 A1* | 3/2016 | Fukuzumi | H01L 21/185 438/107 |
| 2016/0149049 A1* | 5/2016 | Sharangpani | H10B 41/50 257/314 |
| 2016/0163635 A1* | 6/2016 | Yun | H01L 23/528 257/659 |
| 2017/0074738 A1* | 3/2017 | Geisberger | G01L 9/0073 |
| 2017/0077175 A1* | 3/2017 | Ueda | H01L 27/101 |
| 2017/0330887 A1 | 11/2017 | Kim et al. | |
| 2017/0338241 A1 | 11/2017 | Lee | |
| 2017/0373197 A1* | 12/2017 | Sharangpani | H01L 23/5283 |
| 2018/0151497 A1* | 5/2018 | Makala | H01L 29/7833 |
| 2018/0151589 A1* | 5/2018 | Shimizu | H01L 29/66833 |

FOREIGN PATENT DOCUMENTS

| | | |
|---|---|---|
| CN | 106972038 A | 7/2017 |
| CN | 107658315 A | 2/2018 |
| CN | 107658317 A | 2/2018 |
| JP | 2006194853 A | 7/2006 |
| JP | 2016062901 A | 4/2016 |
| JP | 201826518 A | 1/2017 |
| KR | 10-2013-0031794 A | 3/2013 |

OTHER PUBLICATIONS

Written Opinion of the International Searching Authority issued in corresponding International Application No. PCT/DN2018/093423, dated Mar. 27, 2019, 4 pages.

* cited by examiner

THREE-DIMENSIONAL MEMORY DEVICE HAVING A SHIELDING LAYER AND METHOD FOR FORMING THE SAME

CROSS REFERENCE TO RELATED APPLICATION

This application is a continuation of U.S. application Ser. No. 16/140,427, filed on Sep. 24, 2018, entitled "THREE-DIMENSIONAL MEMORY DEVICE HAVING A SHIELDING LAYER AND METHOD FOR FORMING THE SAME," issued as U.S. Pat. No. 11,043,506, which is a continuation of International Application No. PCT/CN2018/093423, filed on Jun. 28, 2018, entitled "THREE-DIMENSIONAL MEMORY DEVICE HAVING A SHIELDING LAYER AND METHOD FOR FORMING THE SAME," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory device having a shielding layer and fabrication methods thereof are disclosed herein.

In one example, a 3D memory device includes a substrate, a peripheral device disposed on the substrate, a plurality of memory strings each extending vertically above the peripheral device, a semiconductor layer disposed above and in contact with the plurality of memory strings, and a shielding layer disposed between the peripheral device and the plurality of memory strings. The shielding layer includes a conduction region configured to receive a grounding voltage during operation of the 3D memory device.

In another example, a 3D memory device includes a substrate, a plurality of memory strings each extending vertically on the substrate, a peripheral device disposed above the plurality of memory strings, a semiconductor layer disposed above and in contact with the peripheral device, and a shielding layer disposed between the plurality of memory strings and the peripheral device. The shielding layer includes a conduction region configured to receive a grounding voltage during operation of the 3D memory device.

In a different example, a method for forming a 3D memory device is disclosed. A peripheral device is formed on a first substrate. A first interconnect layer including a first plurality of interconnect structures are formed above the peripheral device on the first substrate. A shielding layer including a conduction region is formed above the first interconnect layer on the first substrate. The conduction region of the shielding layer covers substantially an area of the first plurality of interconnect structures in the first interconnect layer. An alternating conductor/dielectric stack and a plurality of memory strings each extending vertically through the alternating conductor/dielectric stack are formed on a second substrate. A second interconnect layer including a second plurality of interconnect structures is formed above the plurality of memory strings on the second substrate. The first substrate and the second substrate are bonded in a face-to-face manner, such that the shielding layer is between the first interconnect layer and the second interconnect layer.

In another example, a method for forming a 3D memory device is disclosed. An alternating conductor/dielectric stack and a plurality of memory strings each extending vertically through the alternating conductor/dielectric stack are formed on a first substrate. A first interconnect layer including a first plurality of interconnect structures is formed above the plurality of memory strings on the first substrate. A shielding layer including a conduction region is formed above the first interconnect layer on the first substrate. The conduction region of the shielding layer covers substantially an area of the first plurality of interconnect structures in the first interconnect layer. A peripheral device is formed on a second substrate. A second interconnect layer including a second plurality of interconnect structures is formed above the peripheral device on the second substrate. The first substrate and the second substrate are bonded in a face-to-face manner, such that the shielding layer is between the first interconnect layer and the second interconnect layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
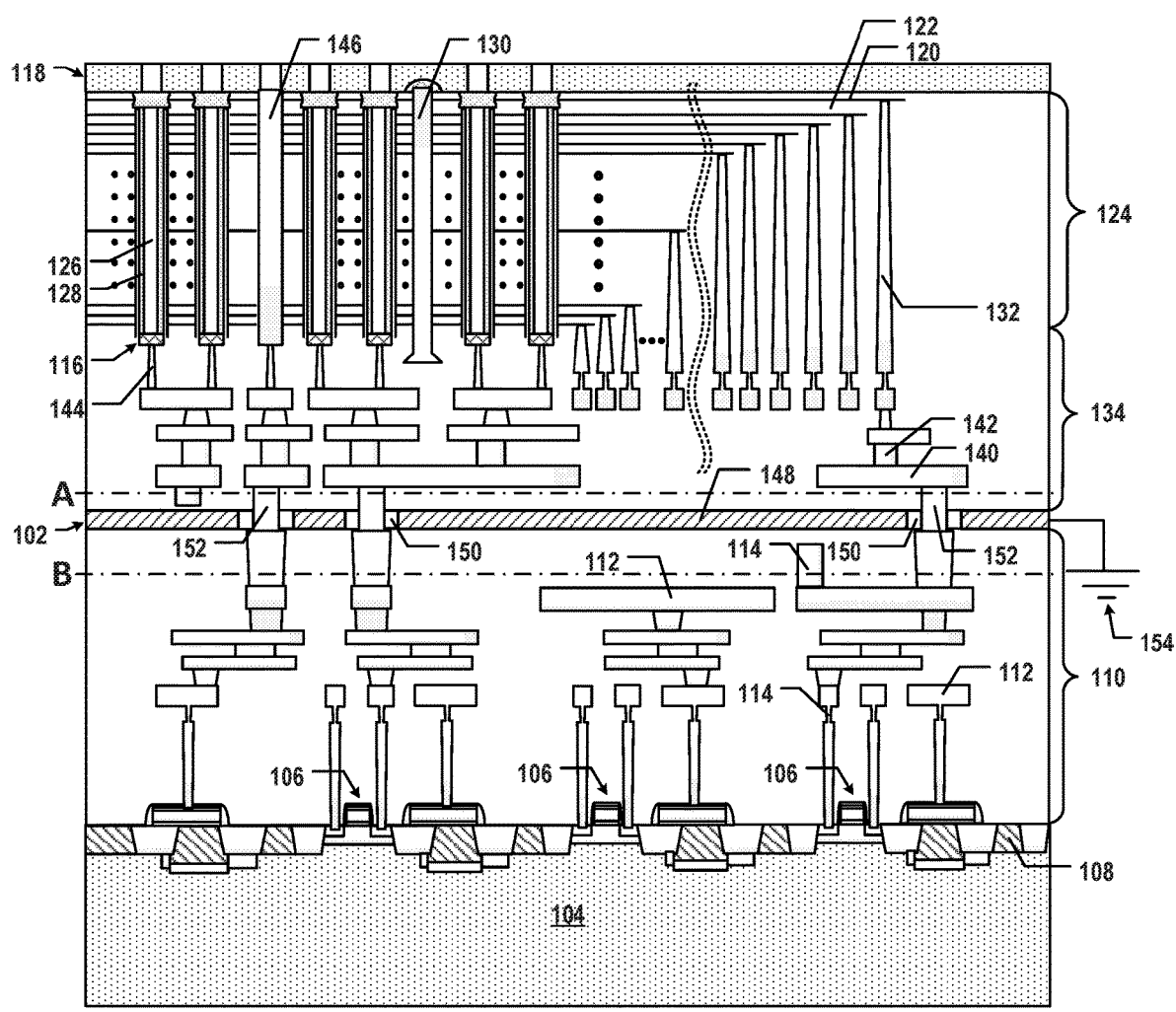
FIG. 1A illustrates a cross-section of an exemplary 3D memory device having a shielding layer, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, the periphery circuits and memory array are stacked to save wafer area and increase memory cell density. The stacked memory device architecture often requires additional metal routing, such as through array contacts (TACs) in memory array, which can result in extra capacitance and resistance. Subsequently, when the noise factor increases, signals can be distorted and therefore, fail in signal integrity during transmission. Moreover, coupling effect between periphery circuits and memory array becomes a serious problem as their metal interconnects are much closer in a stacked memory device architecture than in a non-stacked architecture, thereby exacerbating signal distortion during memory operation.

Various embodiments in accordance with the present disclosure provide a 3D memory device having a shielding layer between the stacked periphery circuits and memory array with a grounding voltage applied on it during the memory operation. The grounding voltage applied to the conductive materials (e.g., metal, metal alloy, metal silicide, doped semiconductor, and/or conductive organic material) in the shielding layer can shield the transfer of electrical energy between metal interconnects or any other circuit segments and thus, reduce or even avoid the coupling effect between the stacked periphery circuits and memory array in a 3D memory device during its operation.

Moreover, the periphery circuits and memory array can be formed on separate substrates and later joined by direct bonding. The de-convolution of the peripheral device processing and memory array processing from each other can avoid the memory array-induced thermal budget impact on peripheral devices and improve the performance of the resulting 3D memory device. The shielding layer can be thus formed on either substrate and include a broad range of conductive materials.

FIG. 1A illustrates a cross-section of an exemplary 3D memory device 100 having a shielding layer 102 according to some embodiments of the present disclosure. 3D memory device 100 represents an example of a non-monolithic 3D memory device. The term "non-monolithic" means that the components of 3D memory device 100 (e.g., peripheral devices and memory array) can be formed separately on different substrates and then joined to form a 3D memory device. 3D memory device 100 can include a substrate 104, which can include silicon (e.g., single crystalline silicon), silicon germanium (SiGe), gallium arsenide (GaAs), germanium (Ge), silicon on insulator (SOI), or any other suitable materials.

3D memory device 100 can include a peripheral device on substrate 104. The peripheral device can be formed "on" substrate 104, in which the entirety or part of the peripheral device is formed in substrate 104 (e.g., below the top surface of substrate 104) and/or directly on substrate 104. The peripheral device can include a plurality of transistors 106 formed on substrate 104. Isolation regions 108 (e.g., shallow trench isolations (STIs)) and doped regions (e.g., source regions and drain regions of transistors 106) can be formed in substrate 104 as well.

In some embodiments, the peripheral device can include any suitable digital, analog, and/or mixed-signal peripheral circuits used for facilitating the operation of 3D memory device 100. For example, the peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 104 using complementary metal-oxide-semiconductor (CMOS) technology (also known as a "CMOS chip").

3D memory device 100 can include an interconnect layer 110 above transistors 106 (referred to herein as a "peripheral interconnect layer") to transfer electrical signals to and from transistors 106. Peripheral interconnect layer 110 can include a plurality of interconnects (also referred to herein as "contacts"), including lateral interconnect lines 112 and vertical interconnect access (via) contacts 114. As used herein, the term "interconnects" can broadly include any suitable types of interconnects, such as middle-end-of-line (MEOL) interconnects and back-end-of-line (BEOL) interconnects. Peripheral interconnect layer 110 can further include one or more interlayer dielectric (ILD) layers (also known as "intermetal dielectric (IMD) layers") in which interconnect lines 112 and via contacts 114 can form. That is, peripheral interconnect layer 110 can include interconnect lines 112 and via contacts 114 in multiple ILD layers. Interconnect lines 112 and via contacts 114 in peripheral interconnect layer 110 can include conductive materials including, but not limited to, tungsten (W), cobalt (Co), copper (Cu), aluminum (Al), silicides, or any combination thereof. The ILD layers in peripheral interconnect layer 110 can include dielectric materials including, but not limited to, silicon oxide, silicon nitride, silicon oxynitride, low dielectric constant (low-k) dielectrics, or any combination thereof.

3D memory device 100 can include a memory array device above the peripheral device. It is noted that x and y axes are added in FIG. 1A to further illustrate the spatial relationship of the components in 3D memory device 100. Substrate 104 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 104) in the y-direction (the vertical direction or thickness direction) when the substrate is positioned in the lowest plane of the semiconductor device in the y-direction. The same notion for describing spatial relationship is applied throughout the present disclosure.

In some embodiments, 3D memory device 100 is a NAND Flash memory device in which memory cells are provided in the form of an array of NAND memory strings 116 each extending vertically above the peripheral device (e.g., transistors 106) and substrate 104. The memory array device can include NAND memory strings 116 that extend vertically through a plurality of pairs each including a conductor layer 120 and a dielectric layer 122 (referred to herein as "conductor/dielectric layer pairs"). The stacked conductor/dielectric layer pairs are also referred to herein as an "alternating conductor/dielectric stack" 124. Conductor layers 120 and dielectric layers 122 in alternating conductor/dielectric stack 124 alternate in the vertical direction. In other words, except the ones at the top or bottom of alternating conductor/dielectric stack 124, each conductor layer 120 can be adjoined by two dielectric layers 122 on both sides, and each dielectric layer 122 can be adjoined by two conductor layers 120 on both sides. Conductor layers 120 can each have the same thickness or different thicknesses. Similarly, dielectric layers 122 can each have the same thickness or different thicknesses. Conductor layers 120 can include conductor materials including, but not limited to, W, Co, Cu, Al, doped silicon, silicides, or any combination thereof. Dielectric layers 122 can include dielectric materials including, but not limited to, silicon oxide, silicon nitride, silicon oxynitride, or any combination thereof.

As shown in FIG. 1A, each NAND memory string 116 can include a semiconductor channel 126 and a dielectric layer 128 (also known as a "memory film"). In some embodiments, semiconductor channel 126 includes silicon, such as amorphous silicon, polysilicon, or single crystalline silicon. In some embodiments, dielectric layer 128 is a composite layer including a tunneling layer, a storage layer (also known as "charge trap/storage layer"), and a blocking layer. Each NAND memory string 116 can have a cylinder shape (e.g., a pillar shape). Semiconductor channel 126, the tunneling layer, the storage layer, and the blocking layer are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as an aluminum oxide ($Al_2O_3$), or hafnium oxide ($HfO_2$) or tantalum oxide ($Ta_2O_5$) layer, and so on.

In some embodiments, NAND memory strings 116 further include a plurality of control gates (each being part of a word line). Each conductor layer 120 in alternating conductor/dielectric stack 124 can act as a control gate for each memory cell of NAND memory string 116. Each NAND memory string 116 can include a source select gate at its upper end and a drain select gate at its lower end. As used herein, the "upper end" of a component (e.g., memory NAND string 116) is the end farther away from substrate 104 in the y-direction, and the "lower end" of the component (e.g., NAND memory string 116) is the end closer to substrate 104 in the y-direction. For each NAND memory string 116, the source select gate can be disposed above the drain select gate.

In some embodiments, the memory array device further includes a gate line slit ("GLS") 130 that extends vertically through alternating conductor/dielectric stack 124. GLS 130 can be used to form the conductor/dielectric layer pairs in alternating conductor/dielectric stack 124 by a gate replacement process. In some embodiments, GLS 130 is firstly filled with dielectric materials, for example, silicon oxide, silicon nitride, or any combination thereof, for separating the NAND memory string array into different regions (e.g., memory fingers and/or memory blocks). Then, GLS 130 is filled with conductive and/or semiconductor materials, for example, W, Co, polysilicon, or any combination thereof, for electrically controlling an array common source (ACS).

In some embodiments, the memory array device further includes word line via contacts 132 in a staircase structure region of alternating conductor/dielectric stack 124. Word line via contacts 132 can extend vertically within a dielectric layer. Each word line via contact 132 can have its upper end in contact with corresponding conductor layer 120 in alternating conductor/dielectric stack 124 to individually address a corresponding word line of the memory array device. In some embodiments, the contact holes and/or contact trenches are also filled with a barrier layer, an adhesion glue layer, and/or a seed layer besides the conductor.

In some embodiments, the memory array device further includes a semiconductor layer 118 disposed above and in contact with NAND memory strings 116, for example, on the upper end of each NAND memory string 116. Alternating conductor/dielectric stack 124 can be disposed below semiconductor layer 118. Semiconductor layer 118 can be a thinned substrate on which the memory array device is formed. In some embodiments, semiconductor layer 118 includes single crystalline silicon, in which semiconductor layer 118 is referred to as a "single crystalline silicon layer." In some embodiments, semiconductor layer 118 can include SiGe, GaAs, Ge, or any other suitable materials. Semiconductor layer 118 can also include isolation regions and doped regions (e.g., functioning as an array common source for NAND memory strings 116). Isolation regions (not shown) can extend across the entire thickness or part of the thickness of semiconductor layer 118 to electrically isolate the doped regions.

Similar to the peripheral device, the memory array device of 3D memory device 100 can also include interconnect layers for transferring electrical signals to and from NAND memory strings 116. As shown in FIG. 1A, 3D memory device 100 can include an interconnect layer 134 (referred to herein as an "array interconnect layer") below NAND memory strings 116 and semiconductor layer 118. Array interconnect layer 134 can include a plurality of interconnects, including interconnect lines 140 and via contacts 142 in one or more ILD layers. In some embodiments, the interconnects in array interconnect layer 134 include local interconnects 144 (e.g., bit line via contacts) each having its upper end in contact with the lower end of corresponding NAND memory string 116 and its lower end in contact with interconnect line 140 or via contact 142. Local interconnects 144 can be in contact with the components (e.g., NAND memory strings 116, TACs 146, and GLSs 130) in alternating conductor/dielectric stack 124 directly for fan-out.

Although not shown in FIG. 1A, another interconnect layer (referred to herein as a "BEOL interconnect layer") can be formed above semiconductor layer 118 and include interconnects (e.g., interconnect lines and via contacts) in one or more ILD layers. The BEOL interconnect layer and array interconnect layer 134 can be formed at opposite sides of semiconductor layer 118. In some embodiments, the interconnects in the BEOL interconnect layer can transfer electrical signals between 3D memory device 100 and peripheral circuits.

In some embodiments, the memory array device further includes one or more TACs 146 that extend vertically through alternating conductor/dielectric stack 124. TAC 146 can extend through the entirety of alternating conductor/dielectric stack 124, (e.g., all the conductor/dielectric layer pairs therein) and at least part of semiconductor layer 118. The upper end of TAC 146 can contact an interconnect in the BEOL interconnect layer, and the lower end of TAC 146 can contact another interconnect 140 or 142 in array interconnect layer 134. TAC 146 can thus make an electrical connection between peripheral interconnect layer 110 and the BEOL interconnect layer and carry electrical signals from the peripheral device to the BEOL interconnects of 3D memory device 100.

During the operation of 3D memory device 100 (when 3D memory device 100 is in use, for example, performing cell read, write/program, erase, setting, boosting, etc.), coupling effect between the interconnects in peripheral interconnect layer 110 and array interconnect layer 134 can cause signal distortion. To address this problem, as shown in FIG. 1A, 3D memory device 100 includes shielding layer 102 between transistors 106 and NAND memory strings 116. In some embodiments, shielding layer 102 is formed between peripheral interconnect layer 110 and array interconnect layer 134 to reduce the coupling effect between the interconnects in the adjacent interconnect layers during the operation of 3D memory device 100. As shown in FIG. 1A, peripheral interconnect layer 110 is disposed between transistors 106 and shielding layer 102, and array interconnect layer 134 is disposed between NAND memory strings 116 and shielding layer 102.

Shielding layer 102 can include one or more conduction regions 148 and one or more isolation regions 150. Conduction region 148 can include conductive materials that have a higher electrical conductivity than an undoped semiconductor material, such as undoped silicon (e.g., amorphous silicon, single crystalline silicon, or polysilicon). In some embodiments, conduction region 148 has an electrical conductivity of at least about $1 \times 10^4$ S/m at about 20° C., such as at least $1 \times 10^4$ S/m at 20° C. In some embodiments, conduction region 148 has an electrical conductivity of between about $1 \times 10^4$ S/m and about $1 \times 10^8$ S/m at about 20° C., such as between $1 \times 10^4$ S/m and $1 \times 10^8$ S/m at 20° C. (e.g., $1 \times 10^4$ S/m, $1 \times 10^5$ S/m, $5 \times 10^5$ S/m, $1 \times 10^6$ S/m, $2 \times 10^6$ S/m, $3 \times 10^6$ S/m, $4 \times 10^6$ S/m, $5 \times 10^6$ S/m, $6 \times 10^6$ S/m, $7 \times 10^6$ S/m, 8×10$^6$ S/m, 9×10$^6$ S/m, 1×10$^7$ S/m, 2×10$^7$ S/m, 3×10$^7$ S/m, 4×10$^7$ S/m, 5×10$^7$ S/m, 6×10$^7$ S/m, 7×10$^7$ S/m, 8×10$^7$ S/m, 9×10$^7$ S/m, 1×10$^8$ S/m, any range bounded by the lower end by any of these values, or in any range defined by any two of these values, at 20° C.). The conductive materials in conduction region 148 can include, but are not limited to, metals, metal alloys, metal silicides, doped semiconductors, and conductive organic materials. In some embodiments, conduction region 148 includes one or more metals, such as W, Cu, Co, Al, nickel (Ni), and titanium (Ti). Conduction region 148 can also include any other suitable metals, such as silver (Ag), gold (Au), platinum (Pt), ruthenium (Ru), etc. In some embodiments, conduction region 148 includes one or more metal alloys, each of which is an alloy of at least two of Cu, Co, Ni, Ti, and W (e.g., TiNi alloy or a combination of TiNi alloy and TiW alloy), or any other suitable metal alloys of, for example, Ag, Al, Au, Pt, iron (Fe), chromium (Cr), etc. In some embodiments, conduction region 148 includes one or more metal silicides, such as copper silicide, cobalt silicide, nickel silicide, titanium silicide, and tungsten silicide. Conduction region 148 can also include any other suitable metal silicides, such as silver silicide, aluminum silicide, gold silicide, platinum silicide, etc. In some embodiments, conduction region 148 includes a semiconductor material doped with a dopant at a concentration such that the electrical conductivity of conduction region 148 is increased into the ranges described above. In some embodiments, conduction region 148 includes a conductive organic material, such as a conductive polymer, having its electrical conductivity in the ranges described above.

In some embodiments, shielding layer 102 has a thickness between about 1 nm and about 1 μm, such as between 1 nm and 1 μm (e.g., 1 nm, 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, any range bounded by the lower end by any of these values, or in any range defined by any two of these values). In some embodiments, shielding layer 102 has a thickness between about 1 μm and about 20 μm, such as between 1 μm and 20 μm (e.g., 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, any range bounded by the lower end by any of these values, or in any range defined by any two of these values). In some embodiments, shielding layer 102 is a compound layer having a plurality of films, such as one or more conductive films and dielectric films. The thickness ranges described above may refer to the total thickness of a compound shielding layer or the thickness of the conductive film(s) in a compound shielding layer.

Shielding layer 102 can be patterned to form any suitable layout with different numbers of conduction regions 148 and isolation regions 150 in different arrangements. As shown in FIG. 1A, in order to electrically connect the stacked memory array device (e.g., NAND memory strings 116) and the peripheral device (e.g., transistors 106) on different planes of 3D memory device 100, interconnects are formed between peripheral interconnect layer 110 and array interconnect layer 134. As a result, 3D memory device 100 can include via contacts 152 extending vertically through shielding layer 102. Via contact 152 can be in contact with the interconnects in peripheral interconnect layer 110 and the interconnects in array interconnect layer 134.

In some embodiments, isolation region 150 extends across the entire thickness of shielding layer 102 to electrically isolate conduction region 148 and via contacts 152. Isolation region 150 can include dielectric materials including, but not limited to, silicon oxide, silicon nitride, silicon oxynitride, doped silicon oxide, any other suitable dielectric materials, or any combination thereof. Patterning process (e.g., photolithography and dry/wet etch) can be used for patterning isolation region 150 in shielding layer 102. Isolation region 150 then can be formed by thermal growth and/or thin film deposition of the dielectric materials in the patterned region.

Figure 2:
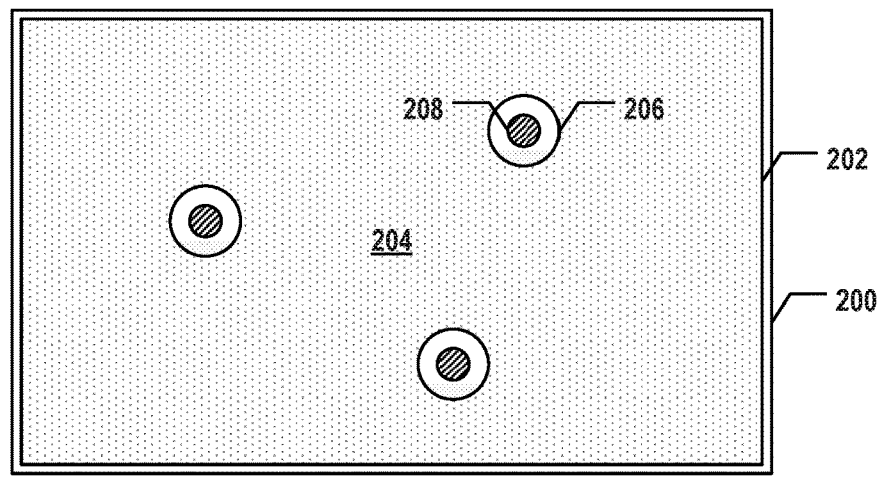
FIG. 2 illustrates a plan view of an exemplary shielding layer, according to some embodiments.

For example, FIG. 2 illustrates a plan view of an exemplary shielding layer 202, according to some embodiments. As shown in FIG. 2, shielding layer 202 includes a conduction region 204 and isolation regions 206 for electrically isolating conduction region 204 and via contacts 208 extending through shielding layer 202. Conduction region 204 can cover substantially the entire area of a substrate 200 except for the areas occupied by isolation regions 206 and via contacts 208.

Figure 3A:
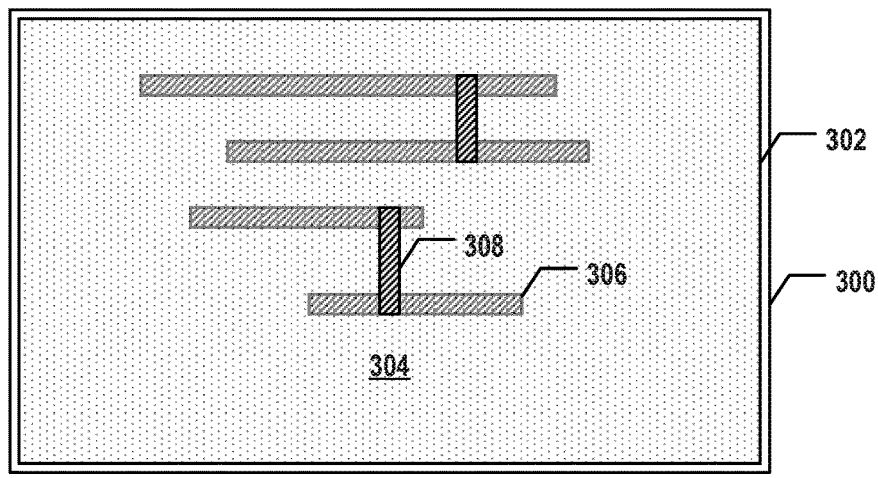
FIG. 3A illustrates an exemplary layout of a shielding layer, according to some embodiments.
Figure 3B:
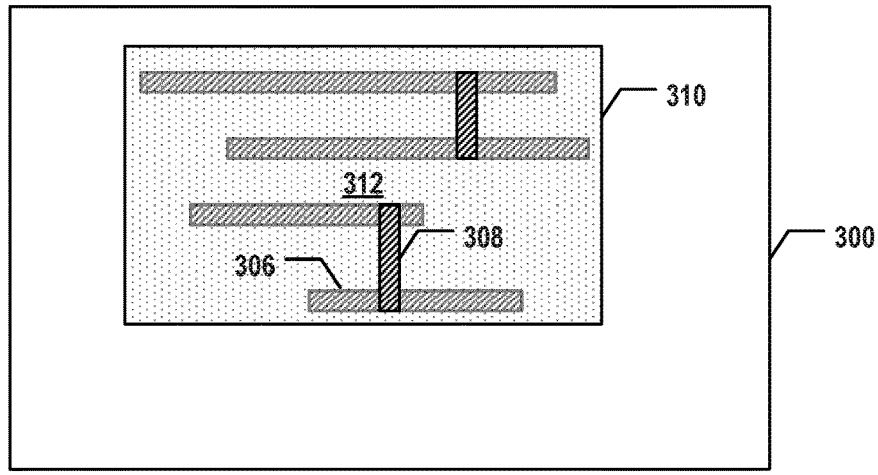
FIG. 3B illustrates another exemplary layout of a shielding layer, according to some embodiments.

In addition to accommodating via contacts 152 through shielding layer 102, the layout of shielding layer 102 can vary with respect to the area it covers. For example. FIGS. 3A-3B illustrate exemplary layouts of shielding layers 302 and 310, according to various embodiments. As shown in FIG. 3A, interconnects 306 and 308 in adjacent interconnect layers are separated vertically by shielding layer 302. A conduction region 304 of shielding layer 302 covers substantially the entire area of a substrate 300 (except for the areas occupied by the isolation regions and via contacts, not shown) regardless of the layout of interconnects 306 and 308. As shown in FIG. 3B, a conduction region 312 of shielding layer 310 does not cover substantially the entire area of substrate 300, but instead, covers the area of interconnects 306 and interconnects 308 in the adjacent interconnect layers separated by shielding layer 310 (e.g., peripheral interconnect layer 110 and array interconnect layer 134 in FIG. 1A). It is understood that the layout of a shielding layer is not limited to the examples illustrated above and can vary in different embodiments as long as its conduction region covers at least the area of interconnects in the adjacent interconnect layers separated by the shielding layer.

In some embodiments, the area of conduction region 304 (having conductive materials such as metals) is below 50% of the area of substrate 300 to avoid metal diffusion issue and/or increase the strength of hybrid bonding between the two semiconductor chips having the respective peripheral device and memory array device. That is, the area of the isolation regions (having dielectric materials such as silicon oxide) is above 50% of the area of substrate 300, according to some embodiments.

Referring back to FIG. 1A, conduction region 148 of shielding layer 102 is configured to receive a grounding voltage during the operation of 3D memory device 100. Conduction region 148 can be electrically connected to a voltage source 154 (or ground) during the operation of 3D memory device 100. In some embodiments, the grounding voltage is between about 0.1 V and about 50 V, such as between 0.1 V and 50 V (e.g., 0.1 V, 0.2 V, 0.3 V, 0.4 V, 0.5 V, 0.6 V, 0.7 V, 0.8 V, 0.9 V, 1 V, 2 V, 3 V, 4 V, 5 V, 6 V, 7 V, 8 V, 9 V, 10 V, 15 V, 20 V, 25 V, 30 V, 35 V, 40 V, 45 V, 50 V, any range bounded by the lower end by any of these values, or in any range defined by any two of these values). It is understood that the grounding voltage can be adjusted based on various attributes of shielding layer 102, such as the thickness and electrical conductivity. During the operation of 3D memory device 100, the grounding voltage applied to conduction region 148 of shielding layer 102 can reduce (or avoid) the coupling effect between the interconnects in peripheral interconnect layer 110 and array interconnect layer 134.

A bonding interface A or B can be formed between array interconnect layer 134 and peripheral interconnect layer 110. In some embodiments, bonding interface A is formed between array interconnect layer 134 and shielding layer 102. In some embodiments, bonding interface B is formed between peripheral interconnect layer 110 and shielding layer 102. As shown in FIG. 1A, the peripheral device (e.g., transistors 106) are disposed below the memory array device (e.g., NAND memory strings 116) in 3D memory device 100 after bonding.

In some embodiments, a peripheral device chip, including the peripheral device (e.g., transistors 106), peripheral interconnect layer 110, and shielding layer 102, is bonded to a memory array device chip, including NAND memory strings 116 and array interconnect layer 134, in a face-to-face manner at bonding interface A. In some embodiments, a peripheral device chip, including the peripheral device (e.g., transistors 106) and peripheral interconnect layer 110, is bonded to a memory array device chip, including NAND memory strings 116, array interconnect layer 134, and shielding layer 102, in a face-to-face manner at bonding interface B. That is, shielding layer 102 can be overlain on top of either the peripheral device chip or the memory array device chip. The peripheral device chip and the memory array device chip can be bonded using hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, a dielectric film (not shown) is formed on the surface of shielding layer 102 at bonding interface A or B to increase the strength of hybrid bonding. The dielectric film can be formed between shielding layer 102 and peripheral interconnect layer 110 or between shielding layer 102 and array interconnect layer 134 in FIG. 1A.

Figure 1B:
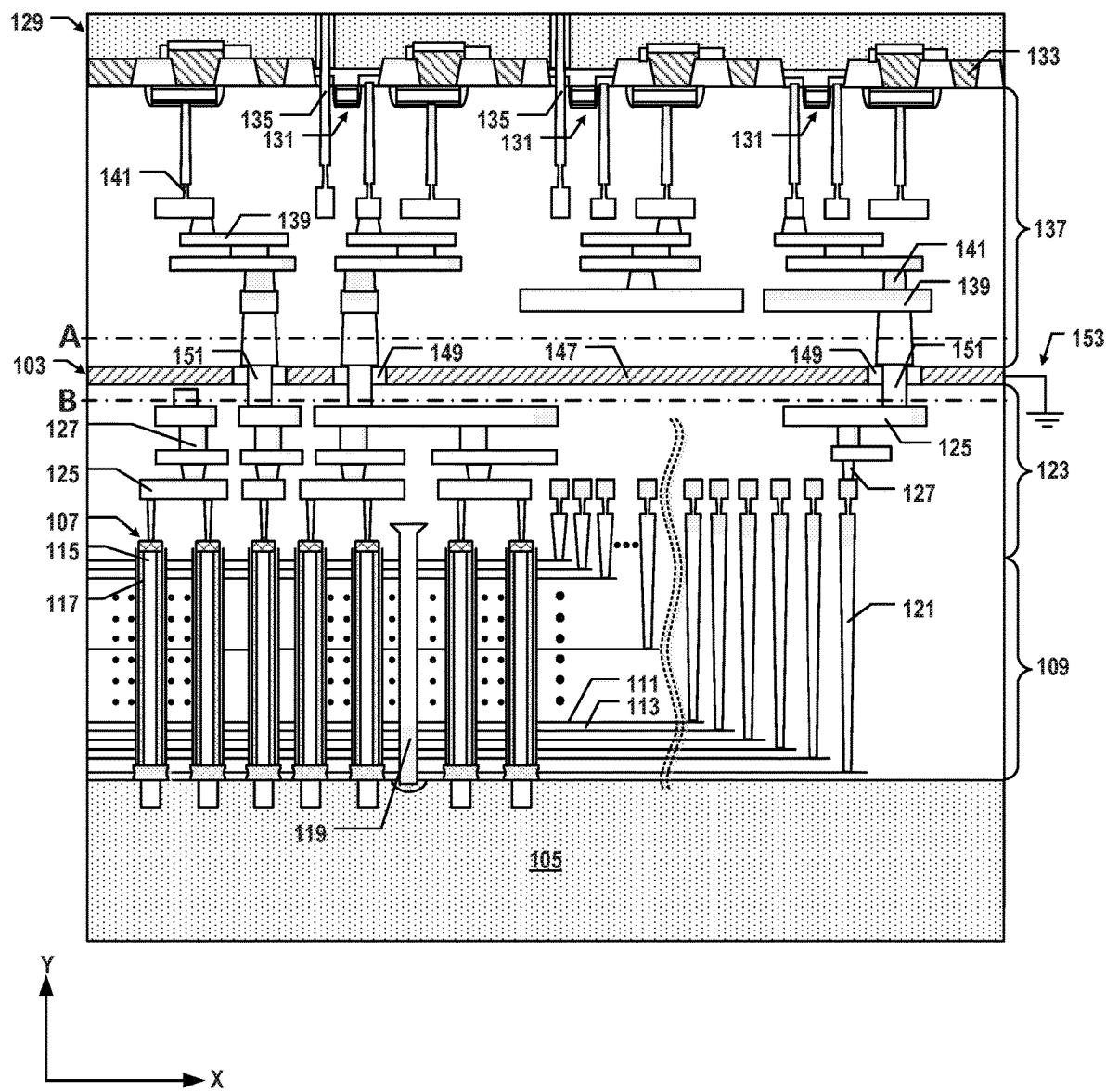
FIG. 1B illustrates a cross-section of another exemplary 3D memory device having a shielding layer, according to some embodiments.

FIG. 1B illustrates a cross-section of another exemplary 3D memory device 101 having a shielding layer 103, according to some embodiments of the present disclosure. Similar to 3D memory device 100 described above in FIG. 1A, 3D memory device 101 represents an example of a non-monolithic 3D memory device in which a peripheral device chip and a memory array device chip are formed separately and bonded in a face-to-face manner at a bonding interface A or B. Different from 3D memory device 100 described above in FIG. 1A in which the peripheral device is below the memory array device, 3D memory device 101 in FIG. 1B includes a peripheral device disposed above a memory array device. It is understood that the details of similar structures (e.g., materials, fabrication process, functions, etc.) in both 3D memory devices 100 and 101 may not be repeated below.

3D memory device 101 can include a memory array device on a substrate 105. In some embodiments, an array of NAND memory strings 107 each extends vertically through an alternating conductor/dielectric stack 109 on substrate 105. Alternating conductor/dielectric stack 109 can include a plurality of pairs each including a conductor layer 111 and a dielectric layer 113. As shown in FIG. 1B, each NAND memory string 107 can include a semiconductor channel 115 and a dielectric layer 117 (also known as a "memory film").

In some embodiments, the memory array device further includes a GLS 119 that extends vertically through alternating conductor/dielectric stack 109. GLS 119 can be used to form the conductor/dielectric layer pairs in alternating conductor/dielectric stack 109 by a gate replacement process. In some embodiments, GLS 119 is filled firstly with dielectric materials, for example, silicon oxide, silicon nitride, or any combination thereof, for separating the NAND memory string array into different regions (e.g., memory fingers and/or memory blocks). In some embodiments, the memory array device further includes word line via contacts 121 in a staircase structure region of alternating conductor/dielectric stack 109. Word line via contacts 121 can extend vertically within a dielectric layer. Each word line via contact 121 can have its lower end in contact with corresponding conductor layer 111 in alternating conductor/dielectric stack 109 to individually address a corresponding word line of the memory array device.

3D memory device 101 can include an interconnect layer 123 above NAND memory strings 107 (referred to herein as an "array interconnect layer") to transfer electrical signals to and from NAND memory strings 107. Array interconnect layer 123 can include a plurality of interconnects, including interconnect lines 125 and via contacts 127. In some embodiments, the interconnects in array interconnect layer 123 also include local interconnects (e.g., bit lines and bit line contacts) each in contact with the upper end of corresponding NAND memory string 107 to individually address corresponding NAND memory string 107. In some embodiments, the interconnects in array interconnect layer 123 also include source lines in contact with the array common sources of NAND memory strings 107.

3D memory device 101 can include a peripheral device (e.g., transistors 131) disposed above the memory array device (e.g., NAND memory strings 107). 3D memory device 101 can further include a semiconductor layer 129 (e.g., a thinned substrate) disposed above and in contact with the peripheral device (e.g., transistors 131). The entirety or part of the peripheral device can be formed in semiconductor layer 129 (e.g., above the bottom surface of semiconductor layer 129) and/or directly below semiconductor layer 129. The peripheral device can include a plurality of transistors 131. Semiconductor layer 129 can be a thinned substrate on which the peripheral device (e.g., transistors 131) is formed. In some embodiments, semiconductor layer 129 includes single crystalline silicon, in which semiconductor layer 129 can be referred to as a "single crystalline silicon layer." In some embodiments, semiconductor layer 129 can include SiGe, GaAs, Ge, or any other suitable materials. Isolation regions 133 (e.g., STIs) and doped regions (e.g., a source region or a drain region of transistor 131) can be formed in semiconductor layer 129 as well.

Similar to the memory array device, the peripheral device of 3D memory device 101 can also include interconnect layers for transferring electrical signals to and from transistors 131. As shown in FIG. 1B, 3D memory device 101 can include an interconnect layer 137 (referred to herein as a "peripheral interconnect layer") below transistors 131 and semiconductor layer 129 and also include an interconnect layer (referred to herein as a "BEOL interconnect layer," not shown) above transistors 131 and semiconductor layer 129.

The BEOL interconnect layer can include a plurality of interconnects in one or more ILD layers. In some embodiments, the BEOL interconnect layer includes any suitable BEOL interconnects that can transfer electrical signals between 3D memory device 101 and peripheral circuits. Peripheral interconnect layer 137 can include a plurality of interconnects, including interconnect lines 139 and via contacts 141 in one or more ILD layers. In some embodiments, the interconnects in peripheral interconnect layer 137 also include via contacts 135 (e.g., through silicon vias (TSVs) if semiconductor layer 129 is a thinned silicon substrate) extending vertically through semiconductor layer 129.

During the operation of 3D memory device 101 (when 3D memory device 101 is in use, for example, performing cell read, write/program, erase, setting, boosting, etc.), coupling effect between the interconnects in array interconnect layer 123 and peripheral interconnect layer 137 can cause signal distortion. To address this problem, as shown in FIG. 1B, 3D memory device 101 includes shielding layer 103 between NAND memory strings 107 and the peripheral device (e.g., transistors 131). In some embodiments, shielding layer 103 is formed between array interconnect layer 123 and peripheral interconnect layer 137 to reduce the coupling effect between the interconnects in the adjacent interconnect layers during the operation of 3D memory device 101. As shown in FIG. 1B, array interconnect layer 123 is disposed between NAND memory strings 107 and shielding layer 103, and peripheral interconnect layer 137 is disposed between transistors 131 and shielding layer 103.

Shielding layer 103 can include one or more conduction regions 147 and one or more isolation regions 149. Shielding layer 103 can be patterned to form any suitable layout with different numbers of conduction regions 147 and isolation regions 149 in different arrangements. As shown in FIG. 1B, in order to electrically connect the stacked memory array device (e.g., NAND memory strings 107) and the peripheral device (e.g., transistors 131) on different planes of 3D memory device 101, interconnects are formed between array interconnect layer 123 and peripheral interconnect layer 137. As a result, 3D memory device 101 can include via contacts 151 extending vertically through shielding layer 103. Via contact 151 can be in contact with the interconnects in array interconnect layer 123 and the interconnects in peripheral interconnect layer 137. In some embodiments, isolation region 149 extends across the entire thickness of shielding layer 103 to electrically isolate conduction region 147 and via contacts 151.

In some embodiments, conduction region 147 of shielding layer 103 is configured to receive a grounding voltage during the operation of 3D memory device 101. Conduction region 147 can be electrically connected to a voltage source 153 (or ground) during the operation of 3D memory device 101. It is understood that the grounding voltage can be adjusted based on various attributes of shielding layer 103, such as the thickness and electrical conductivity. During the operation of 3D memory device 101, the grounding voltage applied to conduction region 147 of shielding layer 103 can reduce (or avoid) the coupling effect between the interconnects in array interconnect layer 123 and peripheral interconnect layer 137. It is understood that other attributes of shielding layer 103 (and its conduction region 147 and isolation region 149) can be similar to those described above with respect to shielding layer 102 in FIGS. 1A, 2, and 3A-3B.

A bonding interface A or B can be formed between array interconnect layer 123 and peripheral interconnect layer 137. In some embodiments, bonding interface A is formed between peripheral interconnect layer 137 and shielding layer 103. In some embodiments, bonding interface B is formed between array interconnect layer 123 and shielding layer 103. As shown in FIG. 1B (and different from FIG. 1A), the peripheral device (e.g., transistors 131) are disposed above the memory array device (e.g., NAND memory strings 107) in 3D memory device 101 after bonding.

In some embodiments, a peripheral device chip, including the peripheral device (e.g., transistors 131), peripheral interconnect layer 137, and shielding layer 103, is bonded to a memory array device chip, including NAND memory strings 107 and array interconnect layer 123, in a face-to-face manner at bonding interface B. In some embodiments, a peripheral device chip, including the peripheral device (e.g., transistors 131) and peripheral interconnect layer 137, is bonded to a memory array device chip, including NAND memory strings 107, array interconnect layer 123, and shielding layer 103, in a face-to-face manner at bonding interface A. That is, shielding layer 103 can be overlain on top of either the peripheral device chip or the memory array device chip. The peripheral device chip and the memory array device chip can be bonded using hybrid bonding. In some embodiments, a dielectric layer (not shown) is formed on the surface of shielding layer 103 at bonding interface A or B to increase the strength of hybrid bonding. The dielectric film can be formed between shielding layer 103 and peripheral interconnect layer 137 or between shielding layer 103 and array interconnect layer 123 in FIG. 1B.

Figure 6:
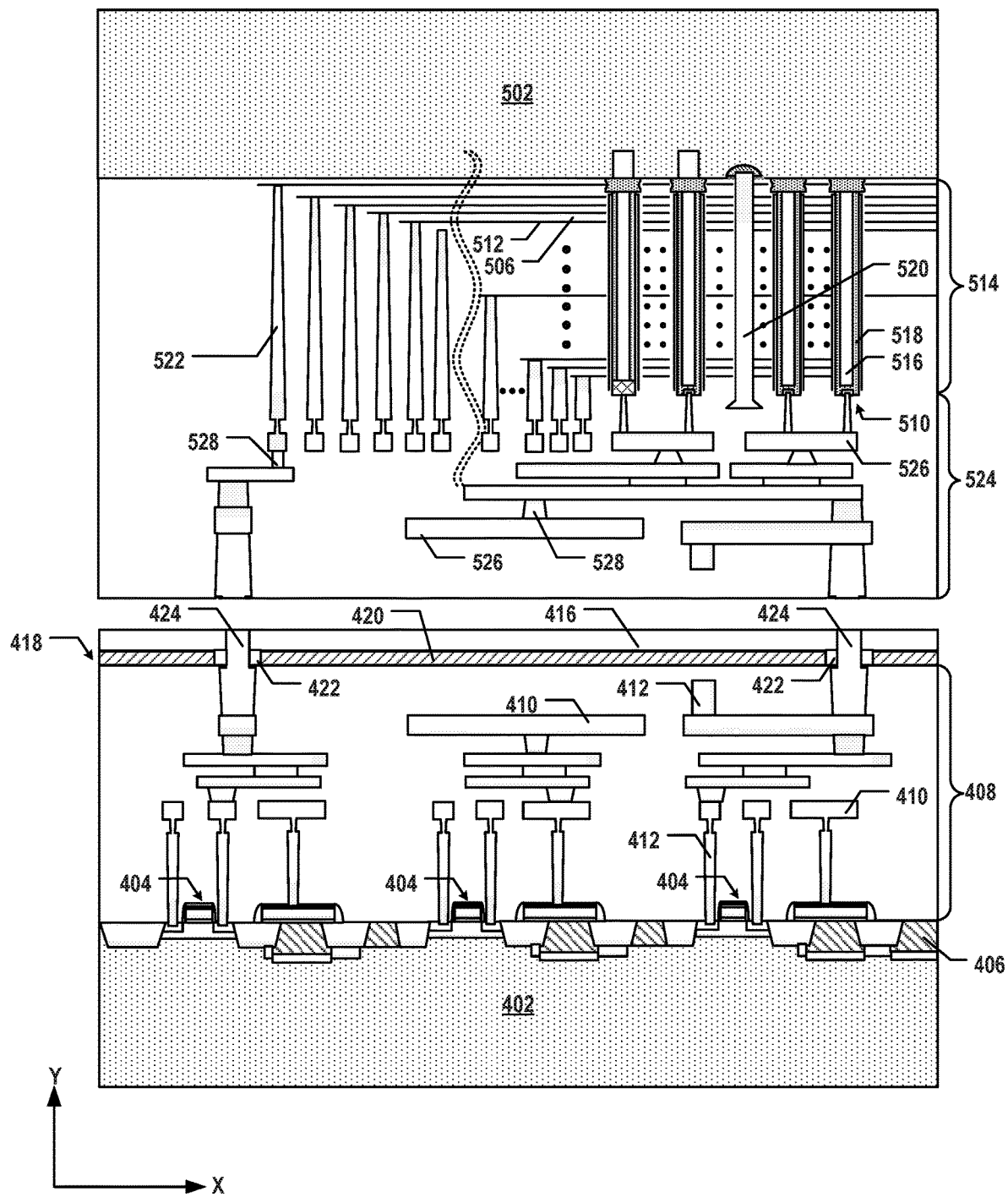
FIG. 6 illustrates a fabrication process for bonding an exemplary memory array device chip and an exemplary peripheral device chip having a shielding layer, according to some embodiments.
Figure 7:
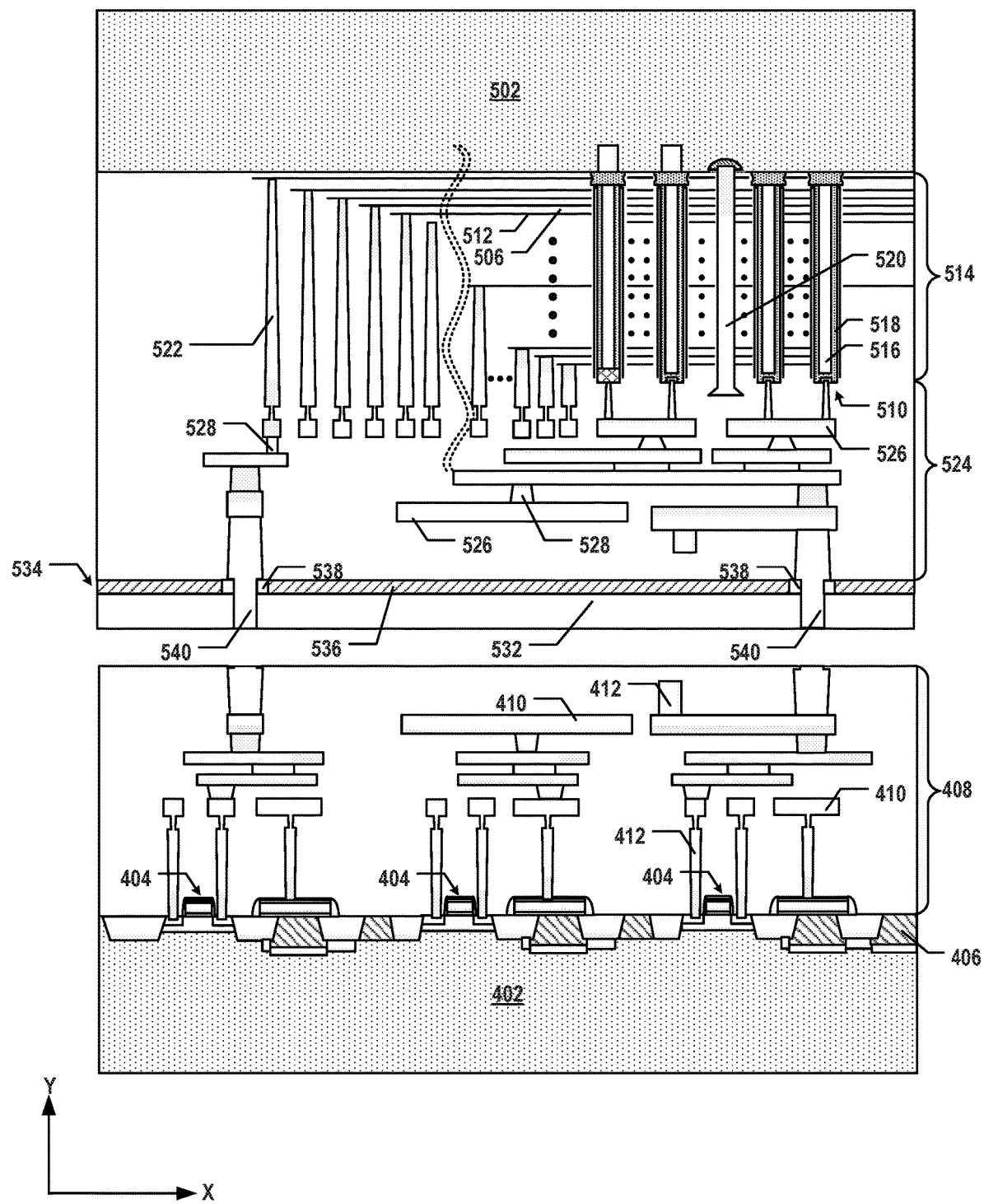
FIG. 7 illustrates a fabrication process for bonding another exemplary memory array device chip having a shielding layer and another exemplary peripheral device chip, according to some embodiments.
Figure 8:
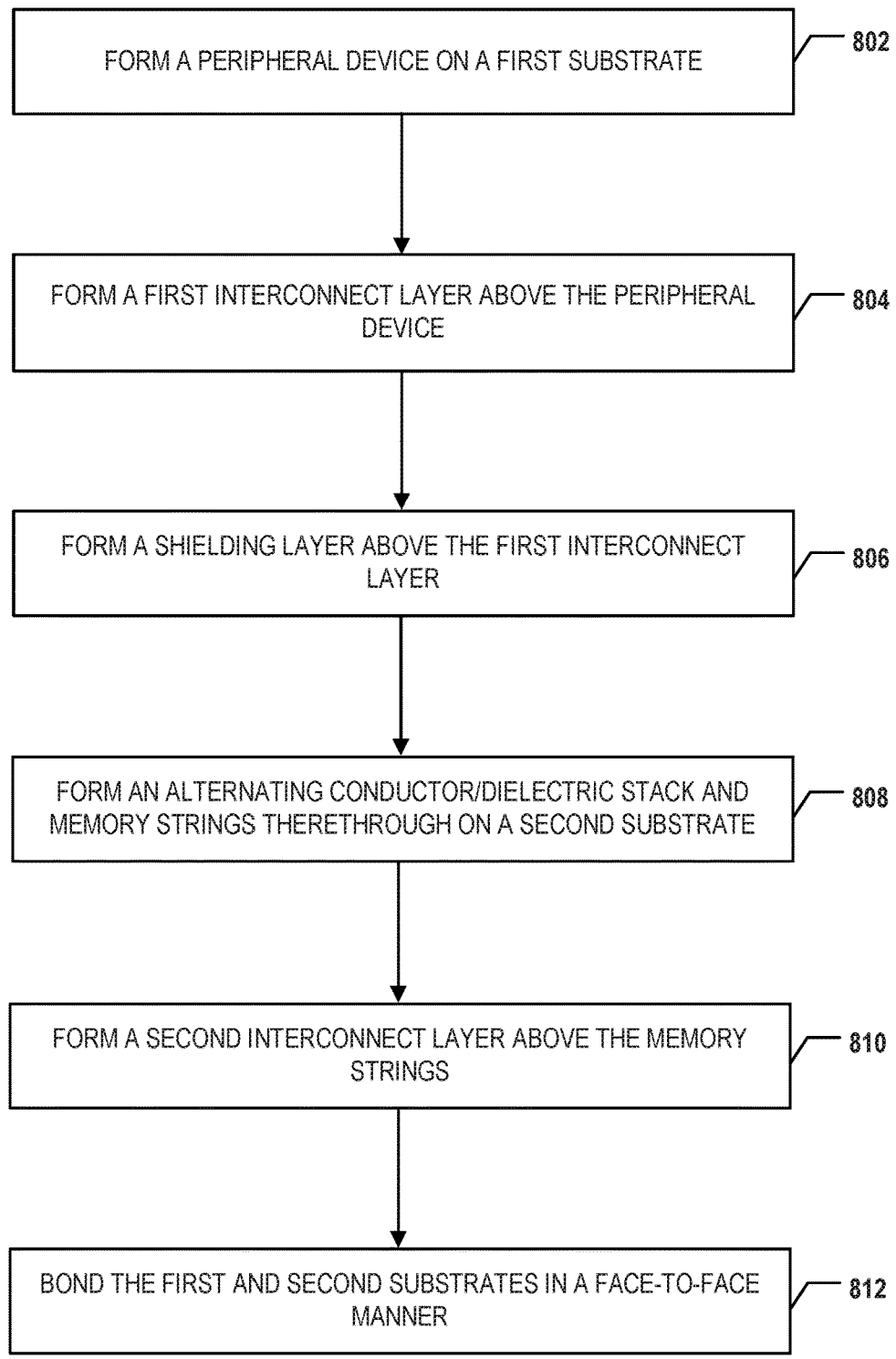
FIG. 8 is a flowchart of a method for forming an exemplary 3D memory device having a shielding layer, according to some embodiments.
Figure 9:
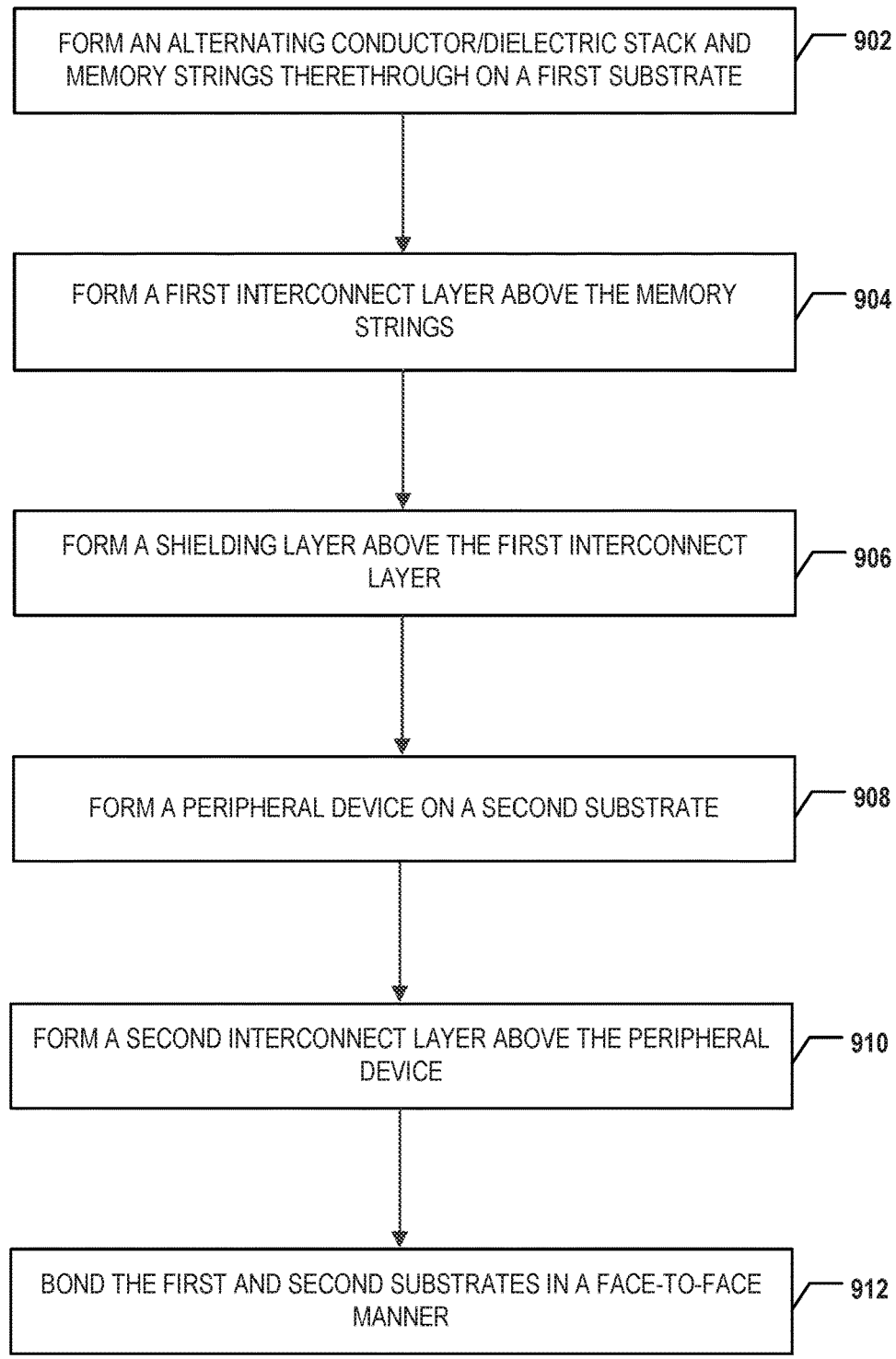
FIG. 9 is a flowchart of a method for forming another exemplary 3D memory device having a shielding layer, according to some embodiments.

FIGS. 4A-4D illustrate a fabrication process for forming an exemplary peripheral device chip, according to some embodiments of the present disclosure. FIGS. 5A-5E illustrate a fabrication process for forming an exemplary memory array device chip, according to some embodiments. FIG. 6 illustrates a fabrication process for bonding an exemplary memory array device chip and an exemplary peripheral device chip having a shielding layer, according to some embodiments. FIG. 7 illustrates a fabrication process for bonding another exemplary memory array device chip having a shielding layer and another exemplary peripheral device chip, according to some embodiments. FIGS. 8-9 are flowcharts of methods for forming exemplary 3D memory devices having a shielding layer, according to various embodiments. Examples of the 3D memory device depicted in FIGS. 4-9 include 3D memory device 100 depicted in FIG. 1A and 3D memory device 101 depicted in FIG. 1B. FIGS. 4-9 will be described together. It is understood that the operations shown in methods 800 and 900 are not exhaustive and that other operations can be performed as well before, after, or between any of the illustrated operations. Further, some of the operations may be performed simultaneously, or in a different order than shown in FIGS. 8-9.

Figure 4A:
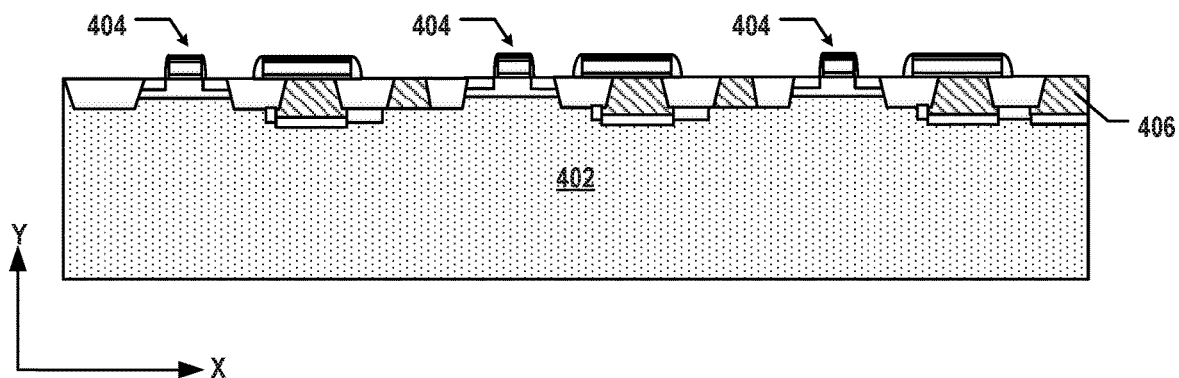
FIGS. 4A-4D illustrate a fabrication process for forming an exemplary peripheral device chip, according to some embodiments.

Referring to FIG. 8, method 800 starts at operation 802, in which a peripheral device is formed on a substrate. Referring to FIG. 9, method 900 includes operation 908, in which a peripheral device is formed on a substrate. The substrate can be a silicon substrate. As illustrated in FIG. 4A, a peripheral device is formed on a silicon substrate 402. The peripheral device can include a plurality of transistors 404 formed on silicon substrate 402. Transistors 404 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 402 by ion implantation and/or thermal diffusion, which function, for example, as source regions and/or drain regions of transistors 404. In some embodiments, isolation regions 406 (e.g., STIs) are also formed in silicon substrate 402 by wet/dry etch and thin film deposition.

Figure 4B:
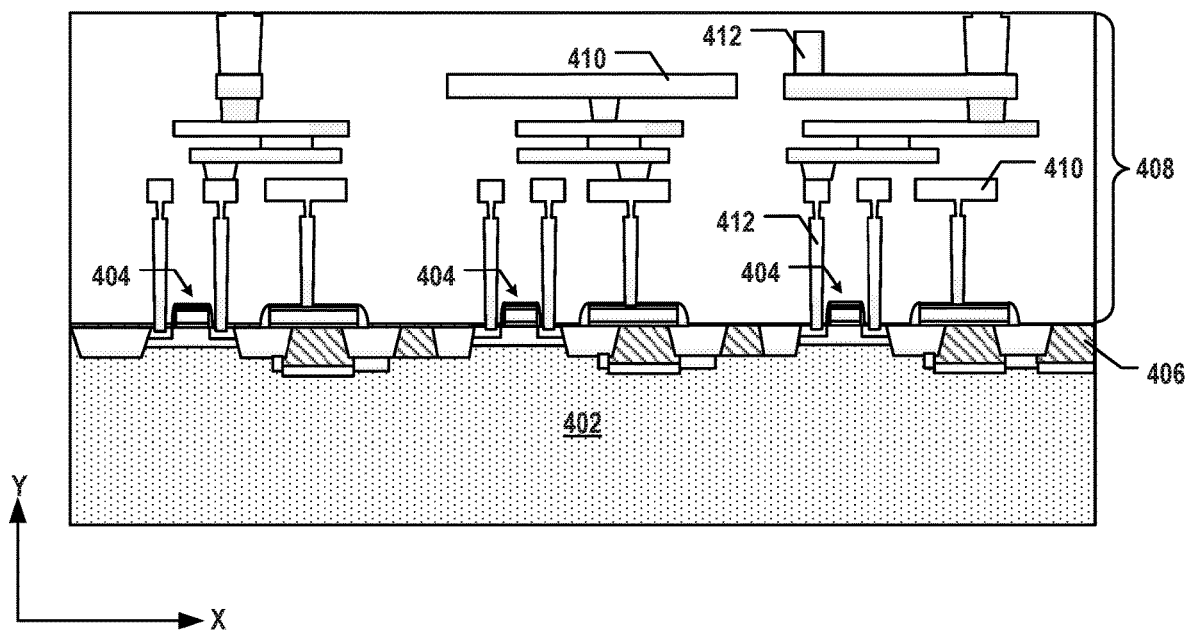

Method 800 proceeds to operation 804, as illustrated in FIG. 8, in which an interconnect layer (e.g., a peripheral interconnect layer) is formed above the peripheral device. Referring to FIG. 9, method 900 includes operation 910, in which an interconnect layer (e.g., a peripheral interconnect layer) is formed above the peripheral device. The peripheral interconnect layer can include a first plurality of interconnects in one or more ILD layers. As illustrated in FIG. 4B, a peripheral interconnect layer 408 can be formed on silicon substrate 402 and above transistors 404. Peripheral interconnect layer 408 can include interconnects, including interconnect lines 410 and via contacts 412 of MEOL and/or BEOL in a plurality of ILD layers, to make electrical connections with the peripheral device (e.g., transistors 404).

In some embodiments, peripheral interconnect layer 408 includes multiple ILD layers and interconnects therein formed in multiple processes. For example, interconnect lines 410 and via contacts 412 can include conductive materials deposited by one or more thin film deposition processes including, but not limited to, CVD, PVD, ALD, electroplating, electroless plating, or any combination thereof. Fabrication processes to form interconnect lines 410 and via contacts 412 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 4B can be collectively referred to as an "interconnect layer" (e.g., peripheral interconnect layer 408).

Method 800 proceeds to operation 806, as illustrated in FIG. 8, in which a shielding layer is formed above the interconnect layer (e.g., the peripheral interconnect layer). Operation 806 can include forming a conduction region and an isolation region above the peripheral interconnect layer. The conduction region can cover the area of the interconnects in the peripheral interconnect layer. In some embodiments, the conduction region of the shielding layer covers substantially the area of the substrate. Method 800 can further include additional operation(s) to form a contact (e.g., via contact) extending vertically through the shielding layer and in contact with the interconnects of the peripheral interconnect layer. The contact can be electrically isolated from the conduction region in the shielding layer by the isolation region.

Figure 4C:
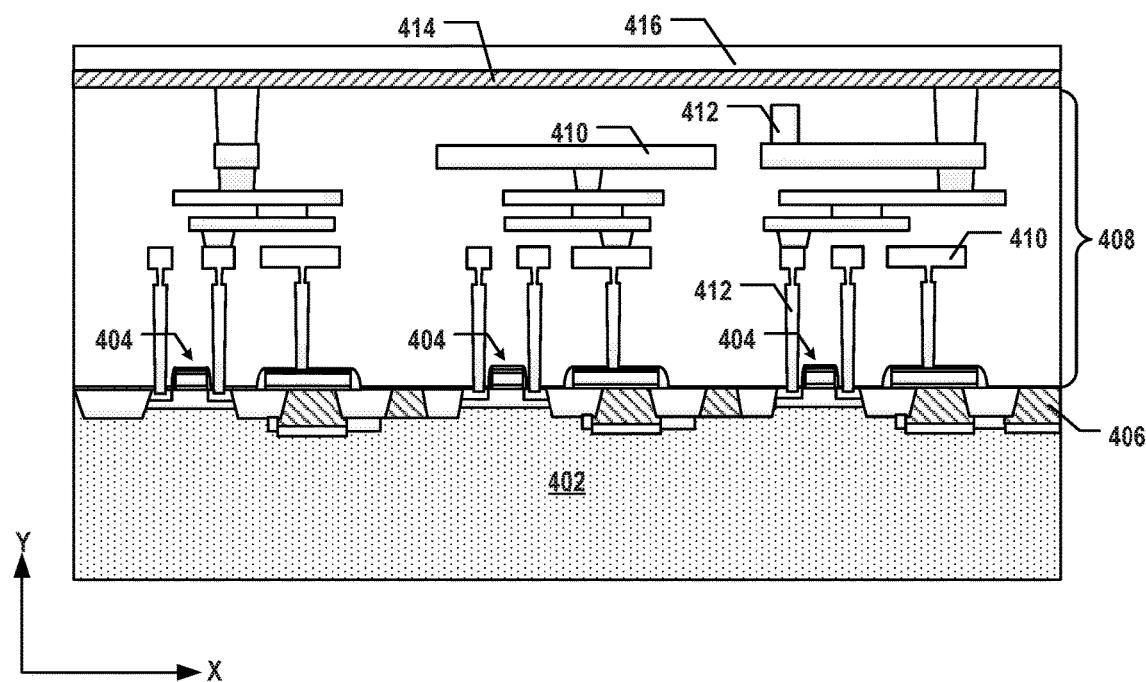

As illustrated in FIG. 4C, a conductive film 414 can be formed on the top surface of peripheral interconnect layer 408. The conductive materials in conductive film 414 can include, but not limited to, metals, metal alloys, metal silicides, doped semiconductors, and conductive organic materials. In some embodiments, conductive film 414 includes one or more metals, such as Cu, Co, Ni, Ti, W, or any other suitable metals. In some embodiments, conductive film 414 includes one or more metal alloys, each of which is an alloy of at least two of Cu, Co, Ni, Ti, W (e.g., TiNi alloy or a combination of TiNi alloy and TiW alloy), or any other suitable metal alloys. In some embodiments, conductive film 414 includes one or more metal silicides, such as copper silicide, cobalt silicide, nickel silicide, titanium silicide, tungsten silicide, or any other suitable metal silicides. In some embodiments, conductive film 414 includes one or more doped semiconductors, such as doped polysilicon, doped amorphous silicon, or any other suitable doped semiconductors. In some embodiments, conductive film 414 includes one or more conductive organic materials, such as conductive polymers, or any other suitable conductive organic materials.

Conductive film 414 can be formed by one or more thin film deposition processes including, but not limited to, CVD, PVD, ALD, electroplating, electroless plating, or any combination thereof. Depending on the conductive materials in conductive film 414, the deposition of conductive film 414 may involve multiple processes. In some embodiments, the deposition of a metal silicide conductive film involves deposition of a silicon film, deposition of a metal film, and silicidation of the silicon and metal films by a thermal treatment (e.g., annealing, sintering, or any other suitable processes). In some embodiments, the deposition of a doped semiconductor conductive film involves deposition of a semiconductor film and doping of the semiconductor film with dopants by ion implantation and/or thermal diffusion. In some embodiments, the deposition of a conductive organic material film involves evaporation or solvent-based coating, such as spin-coating and screen printing.

In some embodiments, deposited conductive film 414 has a thickness between about 1 nm and about 1 μm, such as between 1 nm and 1 μm (e.g., 1 nm, 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, any range bounded by the lower end by any of these values, or in any range defined by any two of these values). In some embodiments, deposited conductive film 414 has a thickness between about 1 μm and about 20 μm, such as between 1 μm and about 20 μm (e.g., 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, any range bounded by the lower end by any of these values, or in any range defined by any two of these values).

As illustrated in FIG. 4C, a dielectric film 416 can be formed on conductive film 414. Dielectric film 416 can include dielectric materials including, but not limited to, silicon oxide, silicon nitride, silicon oxynitride, low-k dielectrics, or any combination thereof. Dielectric film 416 can be formed by thermal growth and/or one or more thin film deposition processes including, but not limited to, CVD, PVD, ALD, or any combination thereof.

Figure 4D:
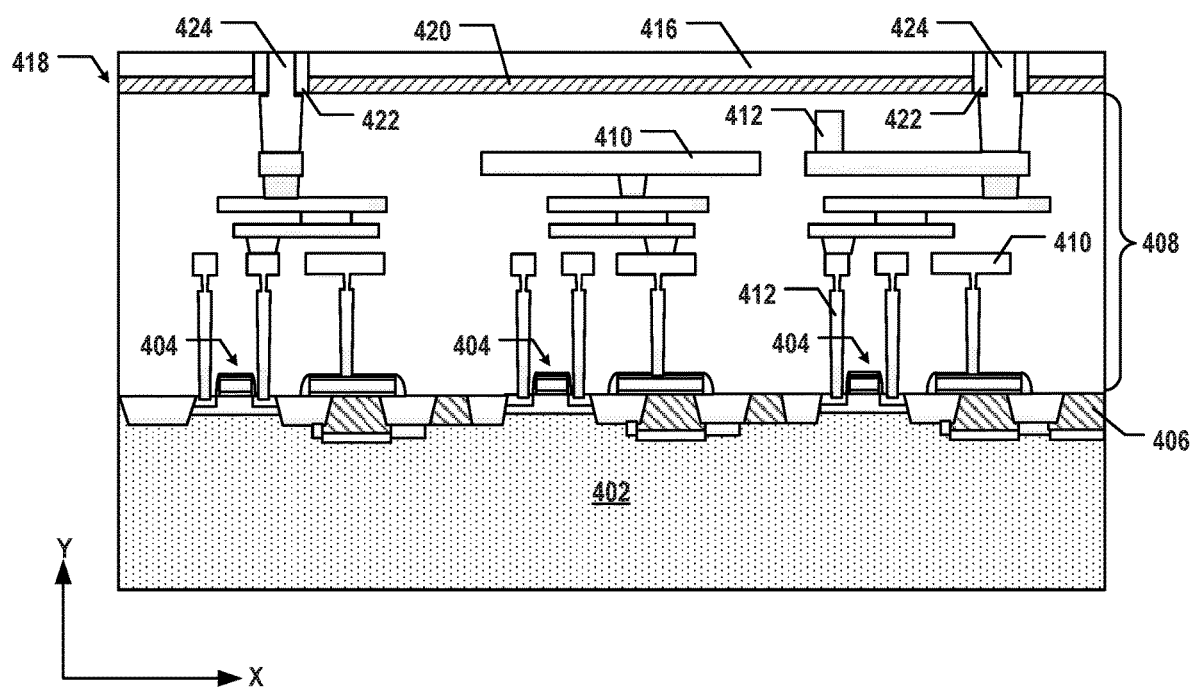

As illustrated in FIG. 4D, conductive film 414 can be patterned to form a shielding layer 418 having a conduction region 420 and one or more isolation regions 422. In some embodiments, conductive film 414 is patterned to form isolation regions 422, and the remaining conductive materials in conductive film 414 become conduction region 420. Conduction region 420 and isolation regions 422 can be collectively referred to herein as shielding layer 418. Isolation region 422 can include dielectric materials including, but not limited to, silicon oxide, silicon nitride, silicon oxynitride, doped silicon oxide, any other suitable dielectric materials, or any combination thereof. Patterning process (e.g., photolithography and dry/wet etch) can be used for patterning isolation regions 422 in shielding layer 418. Isolation regions 422 can then be formed by thermal growth and/or thin film deposition of dielectric materials in the patterned region. Shielding layer 418 can be patterned to form any suitable layout in different arrangements as described above with respect to FIG. 2 and FIGS. 3A-3B.

As illustrated in FIG. 4D, one or more via contacts 424 can be formed through dielectric film 416 and shielding layer 418 and in contact with interconnects 410 and 412 in peripheral interconnect layer 408. Via contacts 424 can be electrically isolated from conduction region 420 of shielding layer 418 by isolation regions 422. In some embodiments, via contacts 424 are formed by first patterning via holes through dielectric film 416 and shielding layer 418 using patterning process (e.g., photolithography and dry/wet etch of dielectric materials in dielectric film 416 and conductive materials in shielding layer 418). The via holes can be filled with a conductor (e.g., W). In some embodiments, filling the via holes includes depositing a barrier layer, an adhesion layer, and/or a seed layer before depositing the conductor.

Method 800 proceeds to operation 808, as illustrated in FIG. 8, in which an alternating conductor/dielectric stack and a plurality of memory strings each extending vertically through the alternating conductor/dielectric stack are formed on a substrate. Referring to FIG. 9, method 900 includes operation 902, in which an alternating conductor/dielectric stack and a plurality of memory strings each extending vertically through the alternating conductor/dielectric stack are formed on a substrate. In some embodiments, a contact (e.g., a TAC) extending vertically through the alternating conductor/dielectric stack is formed as well.

Figure 5A:
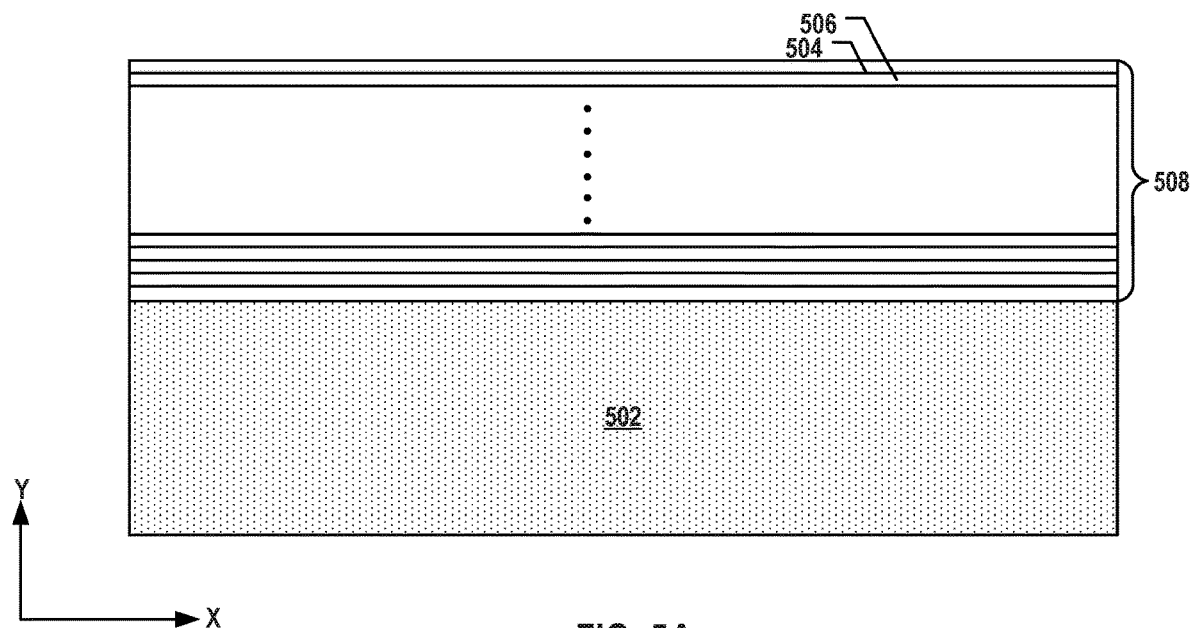
FIGS. 5A-5E illustrate a fabrication process for forming an exemplary memory array device chip, according to some embodiments.

As illustrated in FIG. 5A, pairs of first dielectric layer 504 and second dielectric layer 506 (referred to herein as "dielectric layer pairs") are formed on a silicon substrate 502. The stacked dielectric layer pairs can form an alternating dielectric stack 508. Alternating dielectric stack 508 can include an alternating stack of first dielectric layer 504 and second dielectric layer 506 that is different from first dielectric layer 504. In some embodiments, each dielectric layer pair includes a layer of silicon nitride and a layer of silicon oxide. In some embodiments, first dielectric layers 504 can each have the same thickness or have different thicknesses. Similarly, second dielectric layers 506 can each have the same thickness or have different thicknesses. Alternating dielectric stack 508 can be formed by one or more thin film deposition processes including, but not limited to, CVD, PVD, ALD, or any combination thereof. In some embodiments, alternating dielectric stack 508 can be replaced by a plurality of conductor/dielectric layer pairs, i.e., an alternating stack of a conductor layer (e.g., polysilicon) and a dielectric layer (e.g., silicon oxide).

Figure 5B:
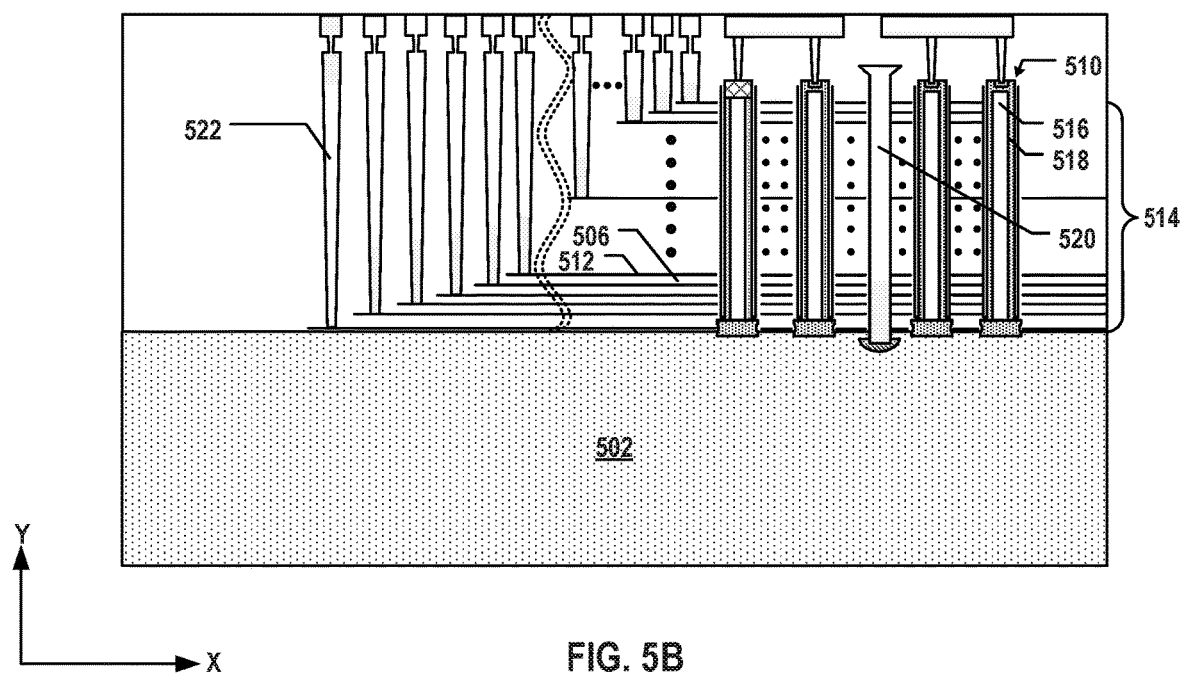

As illustrated in FIG. 5B, NAND memory strings 510 are formed on silicon substrate 502. Each first dielectric layer 504 of alternating dielectric stack 508 can be replaced by a conductor layer 512, thereby forming a plurality of conductor/dielectric layer pairs in an alternating conductor/dielectric stack 514. The replacement of first dielectric layers 504 with conductor layers 512 can be performed by wet/dry etch of first dielectric layers 504 selective to second dielectric layers 506 and filling the structure with conductor layers 512. Conductor layers 512 can include conductive materials including, but not limited to, W, Co, Cu, Al, doped silicon, polysilicon, silicides, or any combination thereof. Conductor layers 512 can be filled by thin film deposition processes, such as CVD, ALD, any other suitable process, or any combination thereof. NAND memory strings 510 can each extend vertically through alternating conductor/dielectric stack 514. In some embodiments, conductor layers 512 in alternating conductor/dielectric stack 514 are used to form the select gates and word lines for NAND memory strings 510. At least some of conductor layers 512 in alternating conductor/dielectric stack 514 (e.g., except the top and bottom conductor layers 512) can each be used as word lines of NAND memory strings 510.

In some embodiments, fabrication processes to form NAND memory string 510 further include forming a semiconductor channel 516 that extends vertically through alternating conductor/dielectric stack 514. In some embodiments, fabrication processes to form NAND memory string 510 further include forming a dielectric layer 518 (memory film) between semiconductor channel 516 and the plurality of conductor/dielectric layer pairs in alternating conductor/dielectric stack 514. Dielectric layer 518 can be a composite dielectric layer, such as a combination of multiple dielectric layers including, but not limited to, a tunneling layer, a storage layer, and a blocking layer.

The tunneling layer can include dielectric materials including, but not limited to, silicon oxide, silicon nitride, silicon oxynitride, or any combination thereof. The storage layer can include materials for storing charge for memory operation. The storage layer materials can include, but not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon oxynitride/silicon oxide (ONO). The blocking layer can further include a high-k dielectric layer, such as an $Al_2O_3$ layer. Semiconductor channel 446 and dielectric layer 448 can be formed by processes such as ALD, CVD, PVD, any other suitable processes, or any combination thereof.

As illustrated in FIG. 5B, a GLS 520 that extends vertically through alternating conductor/dielectric stack 514 can be formed above silicon substrate 502. GLS 520 can include dielectric materials including, but not limited to, silicon oxide, silicon nitride, silicon oxynitride, or any combination thereof. GLS 520 can be formed by a dry/wet etch process to form a vertical opening through alternating conductor/dielectric stack 514, followed by a fill process to fill the opening with dielectric materials. The opening can be filled by CVD, PVD, ALD, any other suitable processes, or any combination thereof.

As illustrated in FIG. 5B, word line via contacts 522 are formed above silicon substrate 502. Each word line via contact 522 can extend vertically through a dielectric layer. In some embodiments, the lower end of word line via contact 522 lands on a word line of NAND memory strings 510 (e.g., conductor layer 512), such that each word line via contact 522 is electrically connected to corresponding conductor layer 512. In some embodiments, fabrication processes to form word line via contacts 522 include forming a vertical opening using a dry/wet etch process, followed by filling the opening with conductor materials and other materials (e.g., a barrier layer, an adhesion layer, and/or a seed layer) for conductor filling, adhesion, and/or other purposes. Word line via contacts 522 can include conductive materials including, but not limited to, W, Co, Cu, Al, doped silicon, silicides, or any combination thereof. The openings of word line via contacts 522 can be filled with conductive materials and other materials by ALD, CVD, PVD, electroplating, any other suitable processes, or any combination thereof.

Figure 5C:
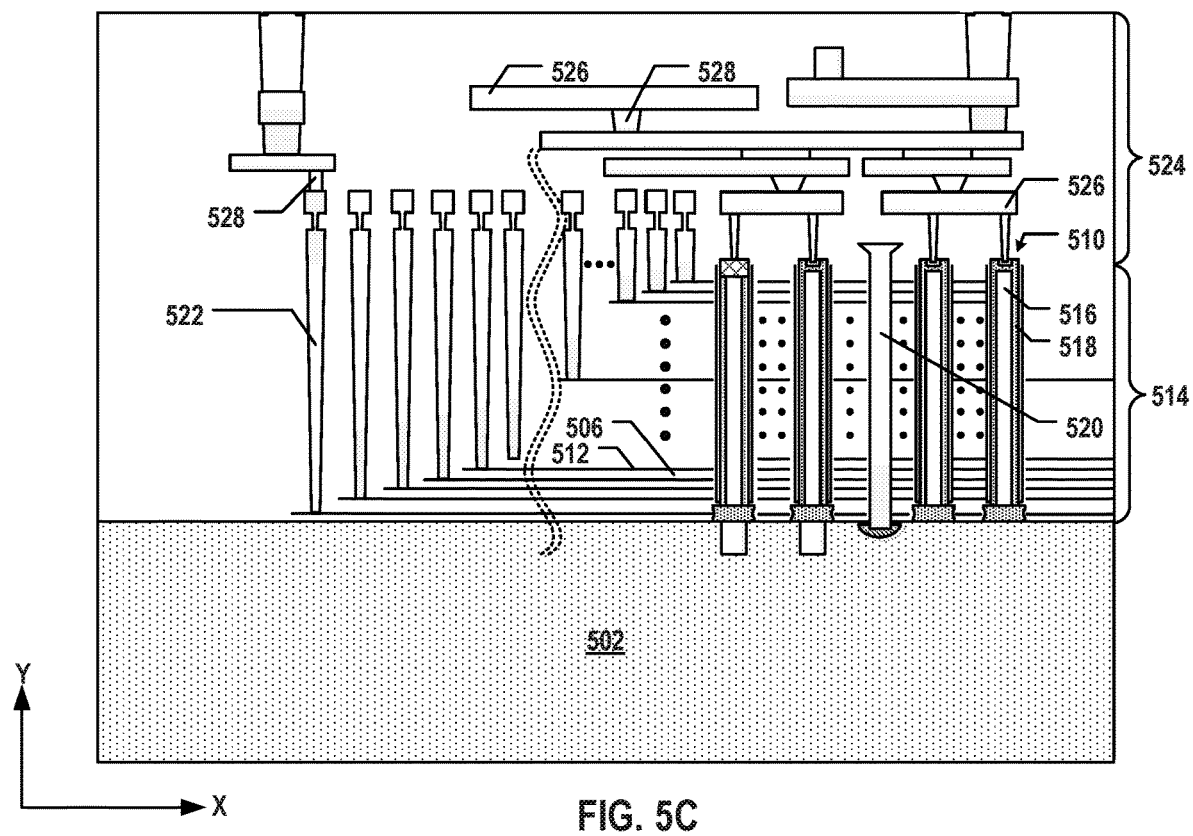

Method 800 proceeds to operation 810, as illustrated in FIG. 8, in which an interconnect layer (e.g., an array interconnect layer) is formed above the memory strings. Referring to FIG. 9, method 900 includes operation 904, in which an interconnect layer (e.g., an array interconnect layer) is formed above the memory strings. The array interconnect layer can include a second plurality of interconnects in one or more ILD layers. As illustrated in FIG. 5C, an array interconnect layer 524 can be formed above alternating conductor/dielectric stack 514 and NAND memory strings 510. Array interconnect layer 524 can include interconnects, including interconnect lines 526 and via contacts 528 in one or more ILD layers for transferring electrical signals to and from NAND memory strings 510.

In some embodiments, array interconnect layer 524 includes multiple ILD layers and interconnects therein formed in multiple processes. For example, interconnect lines 526 and via contacts 528 can include conductive materials deposited by one or more thin film deposition processes including, but not limited to, CVD, PVD, ALD, electroplating, electroless plating, or any combination thereof. Fabrication processes to form interconnect lines 526 and via contacts 528 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 5C can be collectively referred to as an "interconnect layer" (e.g., array interconnect layer 524).

Method 900 proceeds to operation 906, as illustrated in FIG. 9, in which a shielding layer is formed above the interconnect layer (e.g., the array interconnect layer). Operation 906 can include forming a conduction region and an isolation region above the array interconnect layer. The conduction region can cover the area of the interconnects in the array interconnect layer. In some embodiments, the conduction region of the shielding layer covers substantially the area of the substrate. Method 900 can further include additional operation(s) to form a contact (e.g., via contact) extending vertically through the shielding layer and in contact with the interconnects of the array interconnect layer. The contact can be electrically isolated from the conduction region in the shielding layer by the isolation region.

Figure 5D:
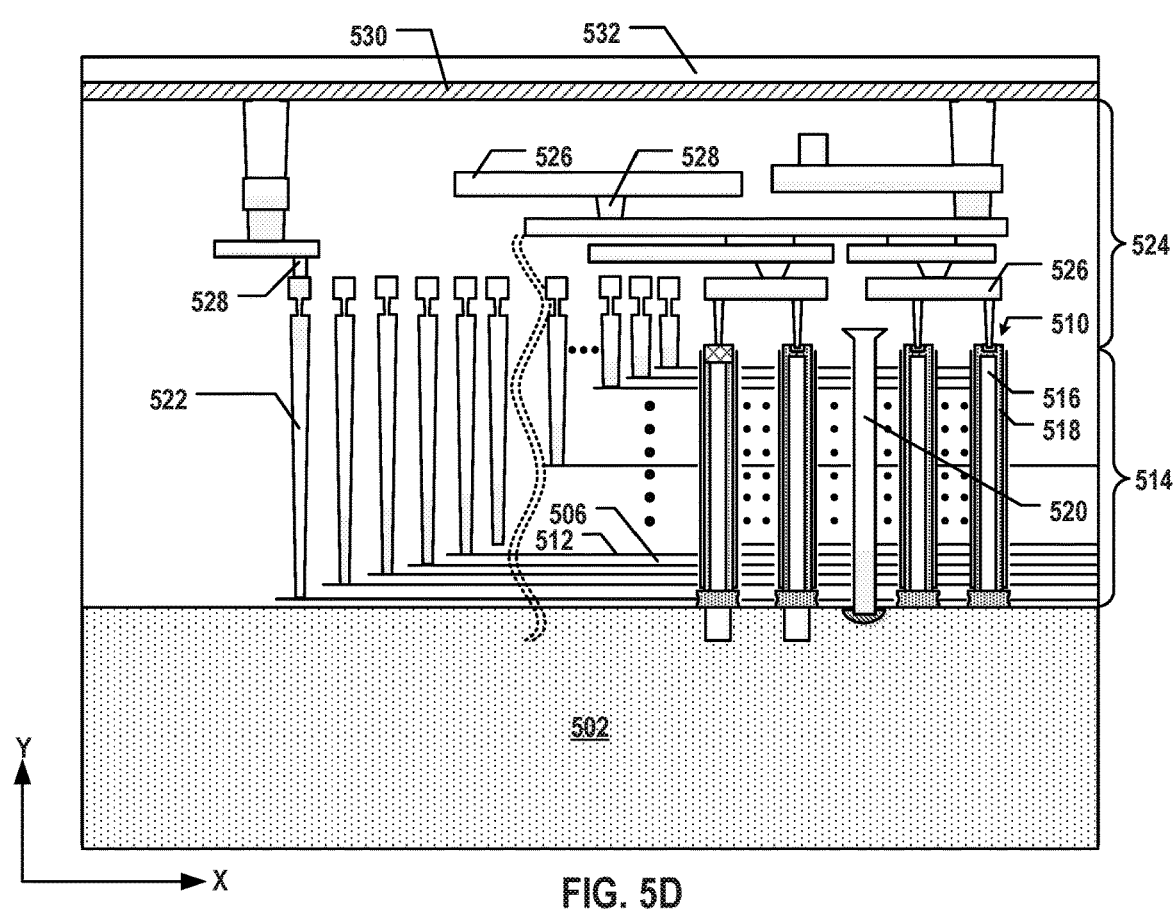

As illustrated in FIG. 5D, a conductive film 530 can be formed on the top surface of array interconnect layer 524. The conductive materials in conductive film 530 can include, but not limited to, metals, metal alloys, metal silicides, doped semiconductors, and conductive organic materials. In some embodiments, conductive film 530 includes one or more metals, such as Cu, Co, Ni, Ti, W, or any other suitable metals. In some embodiments, conductive film 530 includes one or more metal alloys, each of which is an alloy of at least two of Cu, Co, Ni, Ti, W (e.g., TiNi alloy or a combination of TiNi alloy and TiW alloy), or any other suitable metal alloys. In some embodiments, conductive film 530 includes one or more metal silicides, such as copper silicide, cobalt silicide, nickel silicide, titanium silicide, tungsten silicide, or any other suitable metal silicides. In some embodiments, conductive film 530 includes one or more doped semiconductors, such as doped polysilicon, doped amorphous silicon, or any other suitable doped semiconductors. In some embodiments, conductive film 530 includes one or more conductive organic materials, such as conductive polymers, or any other suitable conductive organic materials.

Conductive film 530 can be formed by one or more thin film deposition processes including, but not limited to, CVD, PVD, ALD, electroplating, electroless plating, or any combination thereof. Depending on the conductive materials in conductive film 530, the deposition of conductive film 530 may involve multiple processes. In some embodiments, the deposition of a metal silicide conductive film involves deposition of a silicon film, deposition of a metal film, and silicidation of the silicon and metal films by a thermal treatment (e.g., annealing, sintering, or any other suitable process). In some embodiments, the deposition of a doped semiconductor conductive film involves deposition of a semiconductor film and doping of the semiconductor film with dopants by ion implantation and/or thermal diffusion. In some embodiments, the deposition of a conductive organic material film involves evaporation or solvent-based coating, such as spin-coating and screen printing.

In some embodiments, deposited conductive film 530 has a thickness between about 1 nm and about 1 μm, such as between 1 nm and 1 μm (e.g., 1 nm, 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, any range bounded by the lower end by any of these values, or in any range defined by any two of these values). In some embodiments, deposited conductive film 414 has a thickness between about 1 μm and about 20 μm, such as between 1 μm and about 20 μm (e.g., 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, any range bounded by the lower end by any of these values, or in any range defined by any two of these values).

As illustrated in FIG. 5D, a dielectric film 532 can be formed on conductive film 530. Dielectric film 532 can include dielectric materials including, but not limited to, silicon oxide, silicon nitride, silicon oxynitride, low-k dielectrics, or any combination thereof. Dielectric film 532 can be formed by thermal growth and/or one or more thin film deposition processes including, but not limited to, CVD, PVD, ALD, or any combination thereof.

Figure 5E:
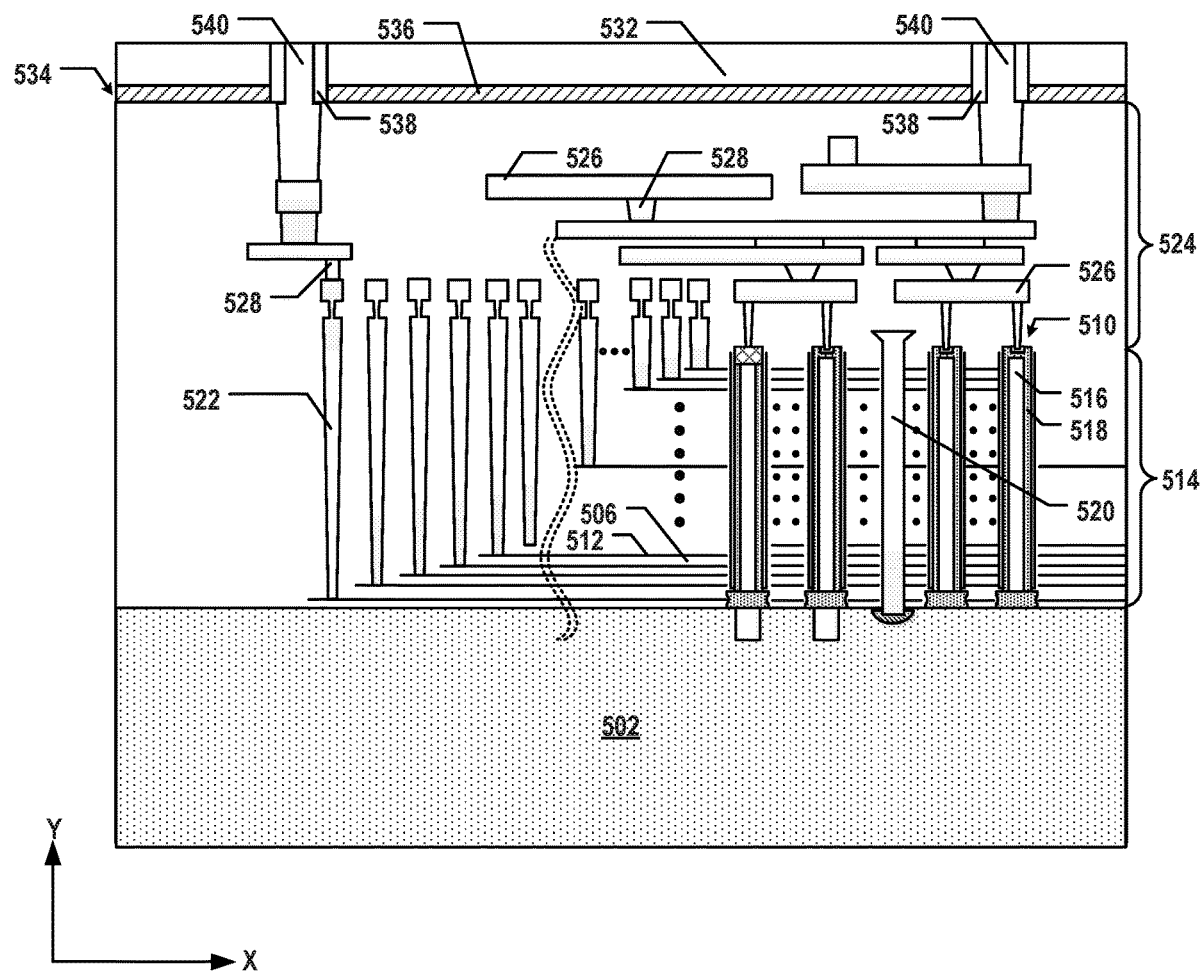

As illustrated in FIG. 5E, conductive film 530 can be patterned to form a shielding layer 534 having a conduction region 536 and one or more isolation regions 538. In some embodiments, conductive film 530 is patterned to form isolation regions 538, and the remaining conductive materials in conductive film 530 become conduction region 536. Conduction region 536 and isolation regions 538 can be collectively referred to herein as shielding layer 534. Isolation region 538 can include dielectric materials including, but not limited to, silicon oxide, silicon nitride, silicon oxynitride, doped silicon oxide, any other suitable dielectric materials, or any combination thereof. Patterning process (e.g., photolithography and dry/wet etch) can be used for patterning isolation regions 538 in shielding layer 534. Isolation regions 538 can then be formed by thermal growth and/or thin film deposition of dielectric materials in the patterned region. Shielding layer 534 can be patterned to form any suitable layout in different arrangements as described above with respect to FIG. 2 and FIGS. 3A-3B.

As illustrated in FIG. 5E, one or more via contacts 540 can be formed through dielectric film 532 and shielding layer 534 and in contact with interconnects 526 and 528 in array interconnect layer 524. Via contacts 540 can be electrically isolated from conduction region 536 of shielding layer 534 by isolation regions 538. In some embodiments, via contacts 540 are formed by first patterning via holes through dielectric film 532 and shielding layer 534 using patterning process (e.g., photolithography and dry/wet etch of dielectric materials in dielectric film 532 and conductive materials in shielding layer 534). The via holes can be filled with a conductor (e.g., W). In some embodiments, filling the via holes includes depositing a barrier layer, an adhesion layer, and/or a seed layer before depositing the conductor.

Method 800 proceeds to operation 812, as illustrated in FIG. 8, in which the substrate on which the peripheral device is formed and the substrate on which the memory strings are formed are bonded in a face-to-face manner, such that the shielding layer is between the peripheral interconnect layer and the array interconnect layer. The bonding can be hybrid bonding. In some embodiments, the substrate on which the peripheral device is formed is disposed above the substrate on which the memory strings are formed are the bonding. In some embodiments, the substrate on which the peripheral device is formed is disposed below the substrate on which the memory strings are formed after the bonding. In method 800, the shielding layer is formed above the peripheral interconnect layer and peripheral device and is part of the peripheral device chip prior to the bonding.

As illustrated in FIG. 6, silicon substrate 502 and components formed thereon (e.g., NAND memory strings 510) are flipped upside down. Array interconnect layer 524 facing down is bonded with dielectric film 416 on shielding layer 418 facing up, i.e., in a face-to-face manner, thereby forming a bonding interface. In some embodiments, a treatment process, e.g., a plasma treatment, a wet treatment, and/or a thermal treatment, is applied to the bonding surfaces prior to the bonding. Although not shown in FIG. 6, silicon substrate 402 and components formed thereon (e.g., transistors 404) can be flipped upside down, and dielectric film 416 on shielding layer 418 facing down can be bonded with array interconnect layer 524 facing up, i.e., in a face-to-face manner, thereby forming a bonding interface. After the bonding, via contacts 424 through dielectric film 416 and shielding layer 418 are aligned and in contact with corresponding interconnect 526 or 528 in array interconnect layer 524, so that the interconnects in array interconnect layer 524 are electrically connected to the interconnects in peripheral interconnect layer 408. In the bonded device, NAND memory strings 510 can be either above or below the peripheral device (e.g., transistors 404). Nevertheless, in method 800 and FIG. 6, the bonding interface is between array interconnect layer 524 and shielding layer 418.

Method 900 proceeds to operation 912, as illustrated in FIG. 9, in which the substrate on which the peripheral device is formed and the substrate on which the memory strings are formed are bonded in a face-to-face manner, such that the shielding layer is between the peripheral interconnect layer and the array interconnect layer. The bonding can be hybrid bonding. In some embodiments, the substrate on which the peripheral device is formed is disposed above the substrate on which the memory strings are formed after the bonding. In some embodiments, the substrate on which the peripheral device is formed is disposed below the substrate on which the memory strings are formed after the bonding. In method 900, the shielding layer is formed above the array interconnect layer and memory strings and is part of the memory array device chip prior to the bonding.

As illustrated in FIG. 7, silicon substrate 502 and components formed thereon (e.g., NAND memory strings 510 and shielding layer 534) are flipped upside down. Dielectric film 532 on shielding layer 534 facing down is bonded with peripheral interconnect layer 408 facing up, i.e., in a face-to-face manner, thereby forming a bonding interface. In some embodiments, a treatment process, e.g., a plasma treatment, a wet treatment, and/or a thermal treatment, is applied to the bonding surfaces prior to the bonding. Although not shown in FIG. 7, silicon substrate 402 and components formed thereon (e.g., transistors 404) can be flipped upside down, and peripheral interconnect layer 408 facing down can be bonded with dielectric film 532 on shielding layer 534 facing up, i.e., in a face-to-face manner, thereby forming a bonding interface. After the bonding, via contacts 540 through dielectric film 532 and shielding layer 534 are aligned and in contact with corresponding interconnect 410 or 412 in peripheral interconnect layer 408, so that the interconnects in array interconnect layer 524 are electrically connected to the interconnects in peripheral interconnect layer 408. In the bonded device, NAND memory strings 510 can be either above or below the peripheral device (e.g., transistors 404). Nevertheless, in method 900 and FIG. 7, the bonding interface is between peripheral interconnect layer 408 and shielding layer 534.

Although not shown, in some embodiments, the substrate on top of the bonded 3D memory device (e.g., silicon substrate 502 or 402) is thinned, so that the thinned top substrate can serve as a semiconductor layer (e.g., semiconductor layer 118 or 129 in FIGS. 1A-1B), for example, a single crystalline silicon layer. The thickness of the thinned substrate can be between about 200 nm and about 5 µm, such as between 200 nm and 5 µm, or between about 150 nm and about 50 µm, such as between 150 nm and 50 µm. The substrate can be thinned by processes including, but not limited to, wafer grinding, dry etch, wet etch, CMP, any other suitable processes, or any combination thereof. In some embodiments, a BEOL interconnect layer is formed above the semiconductor layer (the thinned top substrate). The BEOL interconnect layer can include BEOL interconnects formed in one or more ILD layers. The BEOL interconnects can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, via contacts (e.g., TSVs) are formed extending vertically through the semiconductor layer (the thinned top substrate), for example by wet/dry etch followed by depositing conductive materials. The via contacts can be in contact with the BEOL interconnects in the BEOL interconnect layer.

In some embodiments, prior to the bonding, a TAC (e.g., TAC 146) is formed extending vertically through alternating conductor/dielectric stack 514 and in contact with the interconnects in array interconnect layer 524. After the bonding, via contacts can be formed extending vertically through at least part of the semiconductor layer (the thinned top substrate) and in contact with the TAC, so that the BEOL interconnect layer can be electrically connected to periphery interconnect layer 408.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a peripheral device;
   a plurality of memory strings;
   a layer between the peripheral device and the plurality of memory strings, wherein the layer comprises a conduction region and an isolation region, the conduction region is isolated from both of the peripheral device and the plurality of memory strings; and
   a contact extending through the isolation region of the layer.

2. The 3D memory device of claim 1, further comprising a semiconductor layer in contact with the plurality of memory strings or the peripheral device.

3. The 3D memory device of claim 2, wherein the semiconductor layer comprises monocrystalline silicon.

4. The 3D memory device of claim 2, wherein the semiconductor layer is above and in contact with the peripheral device.

5. The 3D memory device of claim 2, wherein the semiconductor layer is above and in contact with the plurality of memory strings.

6. The 3D memory device of claim 1, wherein the conduction region is grounded.

7. The 3D memory device of claim 6, wherein the conduction region is electrically connected to a voltage source.

8. The 3D memory device of claim 6, wherein the conduction region is configured to receive a grounding voltage during an operation of the 3D memory device.

9. The 3D memory device of claim 1, wherein the conduction region comprises at least one of a metal, a metal alloy, a metal silicide, a doped-semiconductor, or a conducting organic material.

10. The 3D memory device of claim 1, wherein a thickness of the layer is between 1 nm and 1 μm.

11. The 3D memory device of claim 1, further comprising:
    a first interconnect layer between the peripheral device and the layer; and
    a second interconnect layer between the plurality of memory strings and the layer.

12. The 3D memory device of claim 11, wherein the contact is in contact with the first interconnect layer and the second interconnect layer.

13. The 3D memory device of claim 11, wherein the layer is disposed between the first interconnect layer and the second interconnect layer.

14. The 3D memory device of claim 11, wherein the layer is a shielding layer configured to reduce coupling between the first interconnect layer and the second interconnect layer during an operation of the 3D memory device.

15. The 3D memory device of claim 11, further comprising a bonding interface between the first interconnect layer and the second interconnect layer.

16. The 3D memory device of claim 15, wherein the bonding interface is between the first interconnect layer and the layer, or between the second interconnect layer and the layer.

17. The 3D memory device of claim 11, further comprising a dielectric film between the first interconnect layer and the layer, or between the second interconnect layer and the layer.

18. The 3D memory device of claim 11, wherein the conduction region is isolated from the first interconnect layer and the second interconnect layer.

19. A three-dimensional (3D) memory device, comprising:
    a peripheral device;
    a plurality of memory strings;
    a layer between the peripheral device and the plurality of memory strings, wherein the layer comprises a conduction region and an isolation region; and
    a contact extending through the isolation region of the layer;
    wherein the conduction region is grounded and configured to receive a grounding voltage between 0.1 V and 50 V during an operation of the 3D memory device.

20. A three-dimensional (3D) memory device, comprising:
    a peripheral device;
    a plurality of memory strings;
    a layer between the peripheral device and the plurality of memory strings, wherein the layer comprises a conduction region and an isolation region; and
    a contact extending through the isolation region of the layer;
    wherein the conduction region has an electrical conductivity of at least about $1.0 \times 10^4$ S/m at about 20° C.

* * * * *